US012609269B2

(12) United States Patent
Tsuno et al.

(10) Patent No.: US 12,609,269 B2
(45) Date of Patent: Apr. 21, 2026

(54) INSPECTION SYSTEM

(71) Applicant: Hitachi High-Tech Corporation, Tokyo (JP)

(72) Inventors: Natsuki Tsuno, Tokyo (JP); Yasuhiro Shirasaki, Tokyo (JP); Minami Shouji, Tokyo (JP); Daisuke Bizen, Tokyo (JP); Makoto Suzuki, Tokyo (JP); Satoshi Takada, Tokyo (JP); Yohei Nakamura, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 433 days.

(21) Appl. No.: 18/024,797

(22) PCT Filed: Sep. 18, 2020

(86) PCT No.: PCT/JP2020/035615
§ 371 (c)(1),
(2) Date: Mar. 6, 2023

(87) PCT Pub. No.: WO2022/059202
PCT Pub. Date: Mar. 24, 2022

(65) Prior Publication Data
US 2024/0029994 A1 Jan. 25, 2024

(51) Int. Cl.
*H01J 37/22* (2006.01)
*H01J 37/244* (2006.01)

(52) U.S. Cl.
CPC .......... *H01J 37/222* (2013.01); *H01J 37/226* (2013.01); *H01J 37/244* (2013.01); *H01J 2237/2448* (2013.01)

(58) Field of Classification Search
CPC ...... H01J 37/222; H01J 37/226; H01J 37/244; H01J 2237/2448
See application file for complete search history.

(56) References Cited

U.S. PATENT DOCUMENTS 6,477,338 B2 * 11/2002 Hisano .............. G03G 15/0851
399/48
7,205,542 B1 * 4/2007 Mankos .................. H01J 37/28
250/311
(Continued)

FOREIGN PATENT DOCUMENTS

JP 10-12684 A 1/1998
JP 2002-26102 A 1/2002
(Continued)

OTHER PUBLICATIONS

Korean-language Office Action issued in Korean Application No. 10-2023-7005658 dated Jan. 10, 2025 (5 pages).
(Continued)

*Primary Examiner* — Wyatt A Stoffa
(74) *Attorney, Agent, or Firm* — Crowell & Moring LLP

(57) ABSTRACT

This inspection system 100 comprises: an electron source 102 which irradiates a sample 200 with an inspection beam; a detector 105 which detects secondary electrons obtained by irradiating the sample 200 with the inspection beam and outputs a detection signal; a laser device 107 which emits an action laser that changes the amount of secondary electrons; an electron gun 106 which emits an action electron beam that changes the amount of secondary electrons; and a computer system 140 which generates an image of the sample 200 on the basis of the detection signal. The computer system 140 generates an inspection image I1 related to the emission of the inspection beam, acquires the dimensions and the like related to a pattern on the sample 200 on the basis of the inspection image I1, generates an inspection image I2 related to the emission of the action laser and the inspection beam, acquires the material characteristics related to the pattern on the basis of the inspection image I2, generates an inspection image I3 related to the emission of the action electron beam and the inspection beam, and (Continued)

acquires the electrical characteristics related to the pattern on the basis of the inspection image I3.

12 Claims, 29 Drawing Sheets

(56) References Cited

U.S. PATENT DOCUMENTS

| | | | | |
|---|---|---|---|---|
| 8,168,947 B2 * | 5/2012 | Suhara | ................. | H01J 37/244 |
| | | | | 324/458 |
| 8,314,410 B2 * | 11/2012 | Straw | ................... | H01J 37/244 |
| | | | | 250/397 |
| 9,659,744 B2 * | 5/2017 | Tsuno | ............... | G01N 23/2251 |
| 10,984,983 B2 * | 4/2021 | Gamm | ................... | H01J 37/09 |
| 11,056,310 B2 * | 7/2021 | Kawamoto | ............ | H01J 37/28 |
| 2002/0093648 A1 | 7/2002 | Nikoonahad et al. | | |
| 2002/0166964 A1 * | 11/2002 | Talbot | .................... | H01J 37/28 |
| | | | | 250/307 |
| 2004/0026633 A1 * | 2/2004 | Gunji | ................... | H01J 37/244 |
| | | | | 250/492.1 |
| 2005/0045820 A1 * | 3/2005 | Ohshima | .............. | H01J 37/244 |
| | | | | 250/310 |
| 2007/0158582 A1 * | 7/2007 | Ward | .................... | B82Y 10/00 |
| | | | | 250/426 |
| 2008/0253792 A1 * | 10/2008 | Suhara | ................. | H01J 37/268 |
| | | | | 399/73 |
| 2010/0133433 A1 * | 6/2010 | Tanimoto | ............. | H01J 37/244 |
| | | | | 250/310 |
| 2011/0163068 A1 * | 7/2011 | Utlaut | ...................... | G03F 1/84 |
| | | | | 216/66 |
| 2011/0248164 A1 * | 10/2011 | Straw | ................... | H01J 37/244 |
| | | | | 250/307 |
| 2014/0097342 A1 * | 4/2014 | Tsuno | ................... | G01B 15/04 |
| | | | | 250/307 |
| 2018/0297147 A1 | 10/2018 | Nishikawa et al. | | |
| 2018/0330511 A1 | 11/2018 | Ha et al. | | |
| 2023/0273254 A1 * | 8/2023 | Mitsugi | ................. | H01J 37/04 |
| 2023/0335374 A1 * | 10/2023 | Gaury | ............... | G01N 23/2251 |

FOREIGN PATENT DOCUMENTS

| | | |
|---|---|---|
| JP | 2004-513509 A | 4/2004 |
| JP | 2017-162557 A | 9/2017 |
| TW | 201901113 A | 1/2019 |
| TW | 201920717 A | 6/2019 |

OTHER PUBLICATIONS

International Search Report (PCT/ISA/210) issued in PCT Application No. PCT/JP2020/035615 dated Dec. 22, 2020 with English translation (four (4) pages).

Japanese-language Written Opinion (PCT/ISA/237) issued in PCT Application No. PCT/JP2020/035615 dated Dec. 22, 2020 (three (3) pages).

Chinese-language Office Action issued in Taiwanese Application No. 110125495 dated Apr. 25, 2022 (five (5) pages).

* cited by examiner

[FIG. 1]
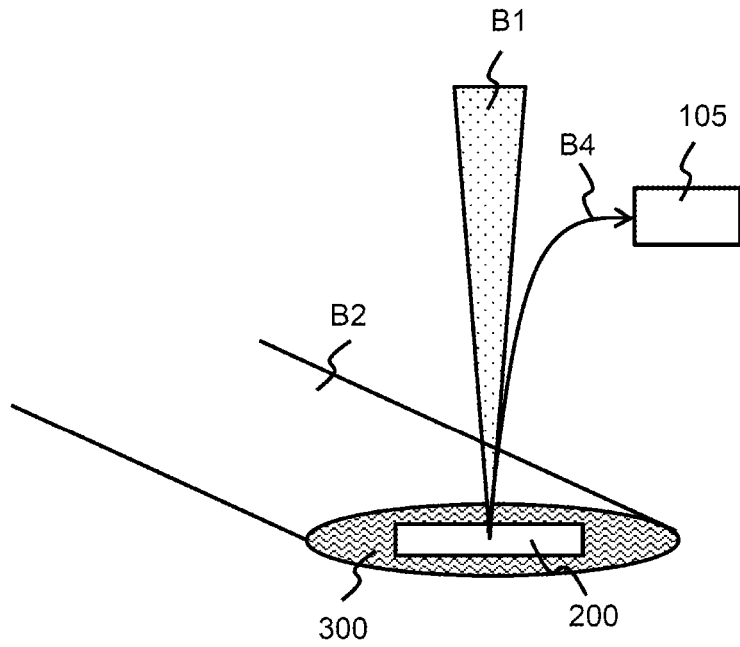
[FIG. 2]
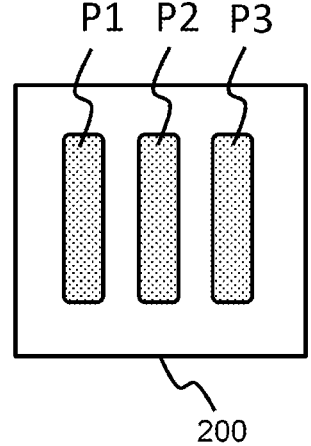

[FIG. 3]
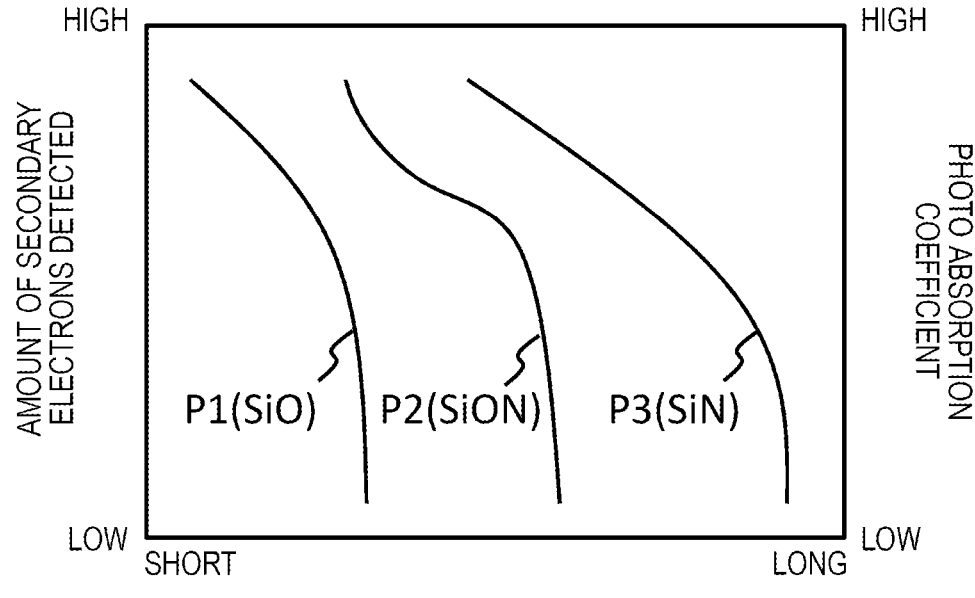
[FIG. 4]
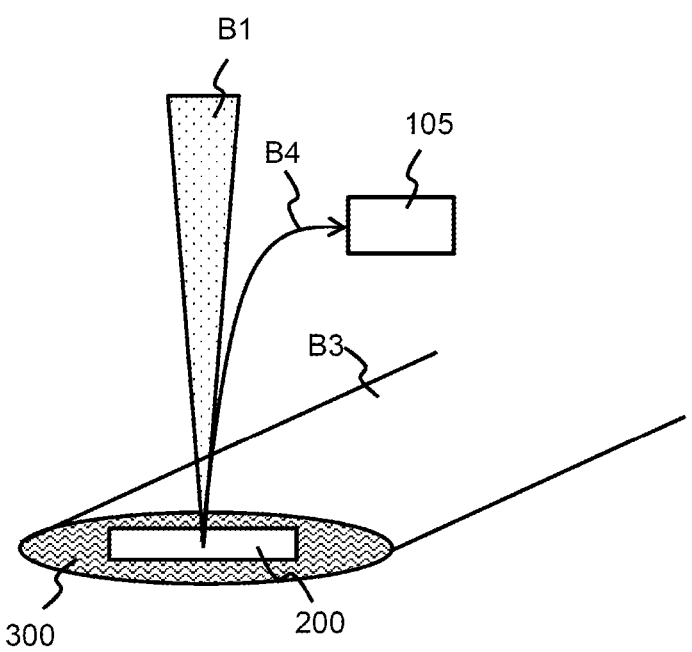

[FIG. 5]
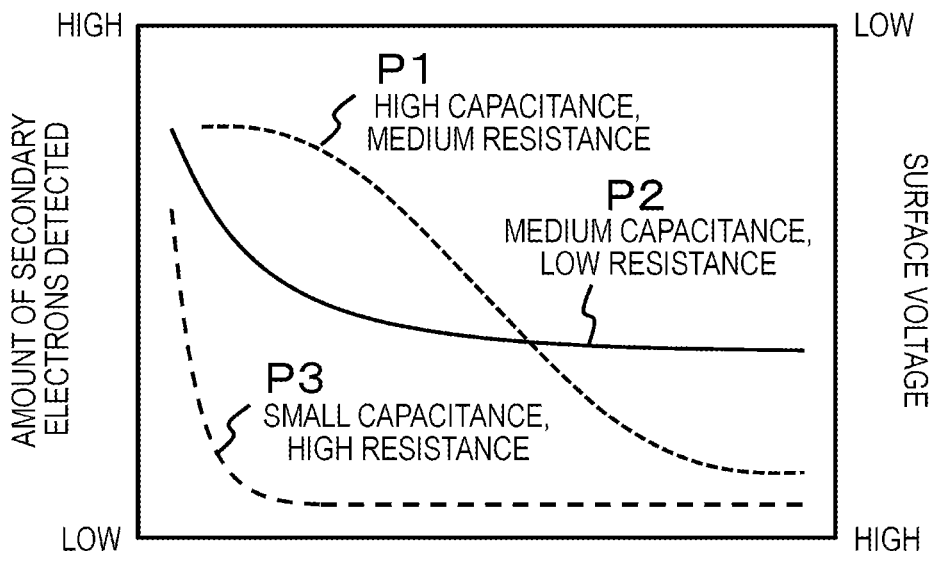
[FIG. 6]
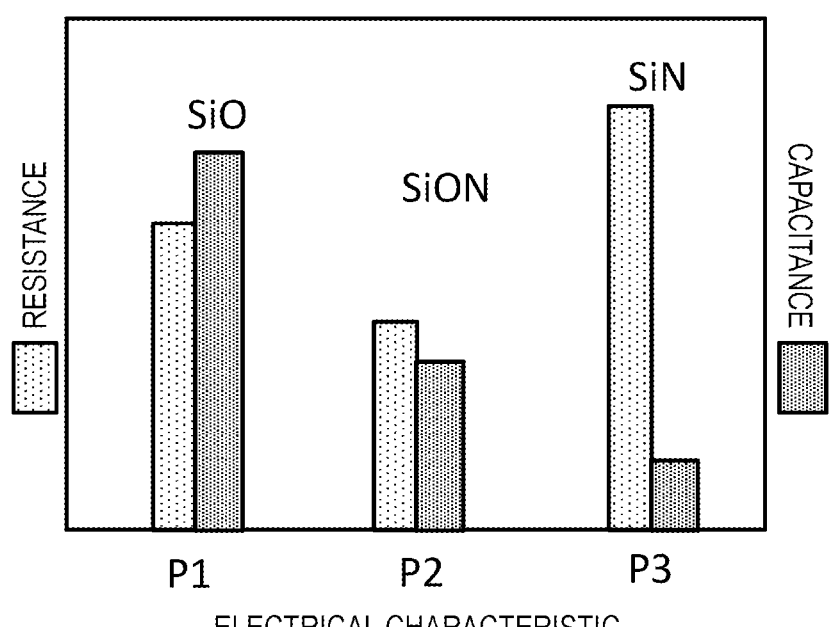

[FIG. 7]
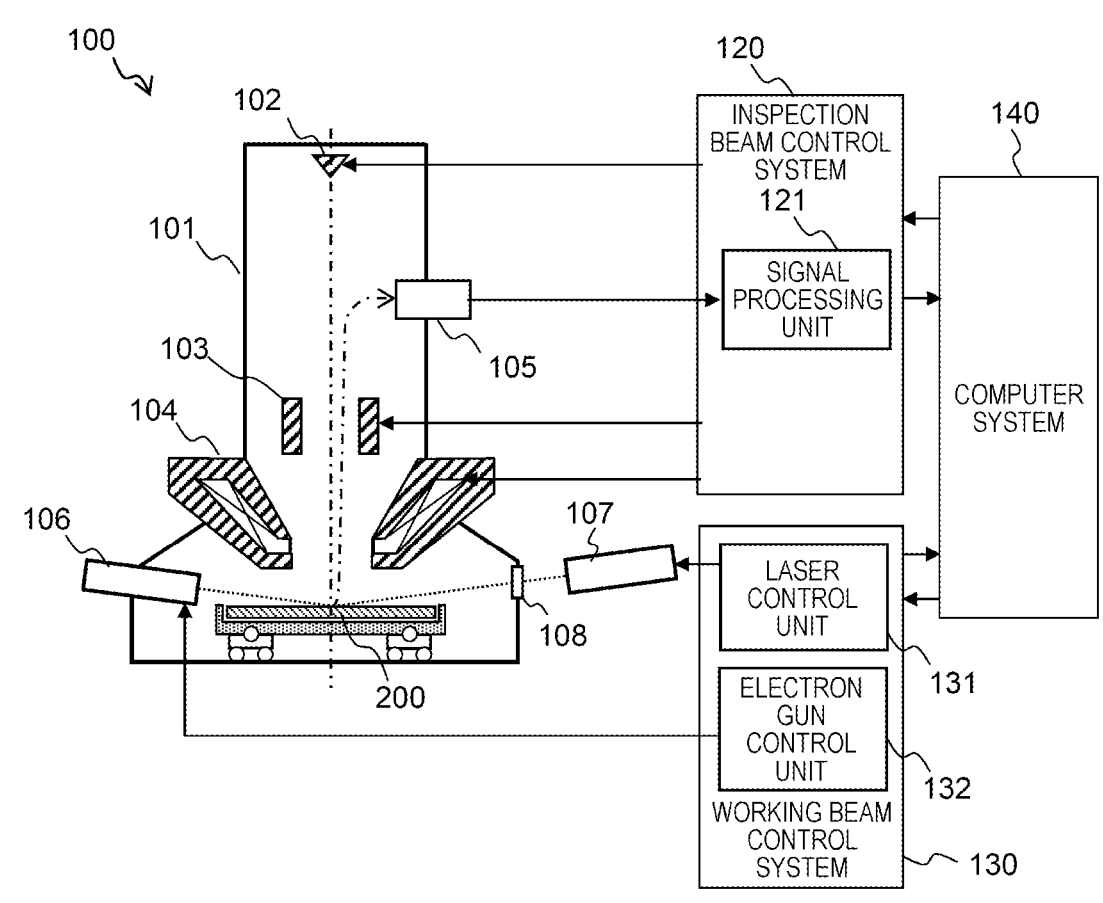
[FIG. 8]
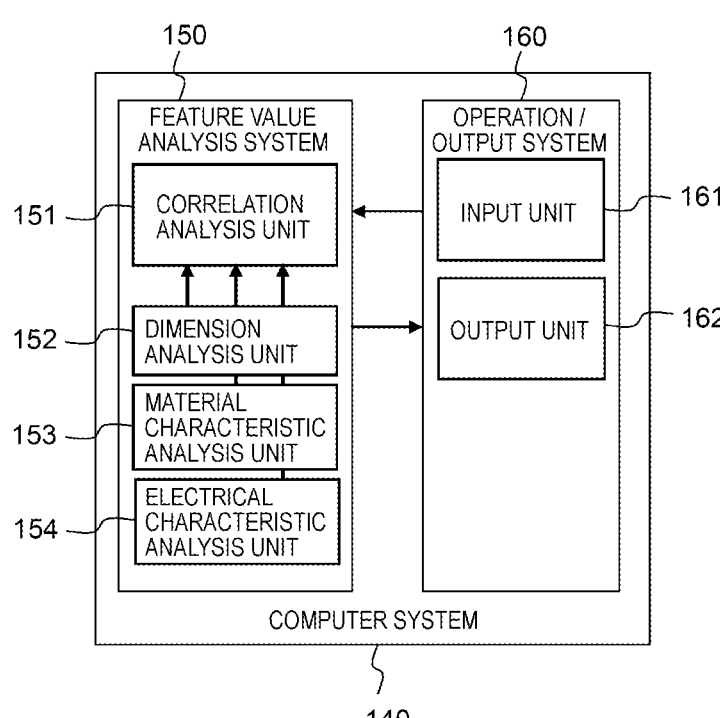

FIG. 9A     DIMENSION MEASUREMENT
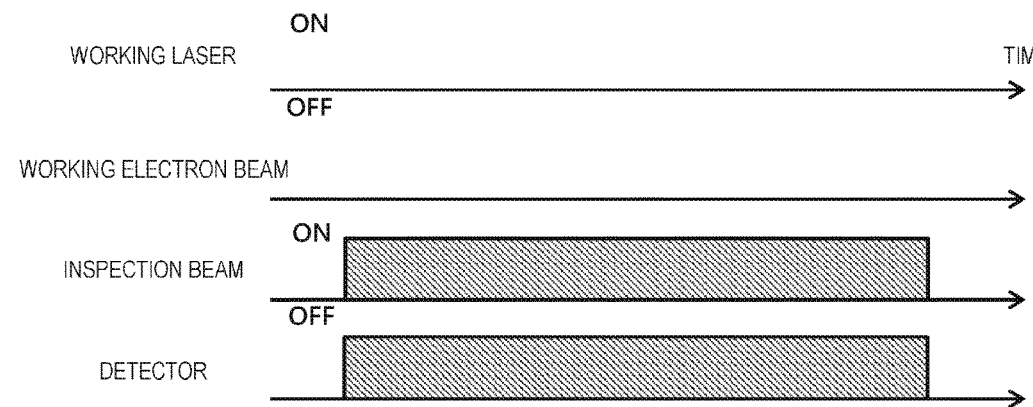
FIG. 9B     MATERIAL CHARACTERISTIC MEASUREMENT
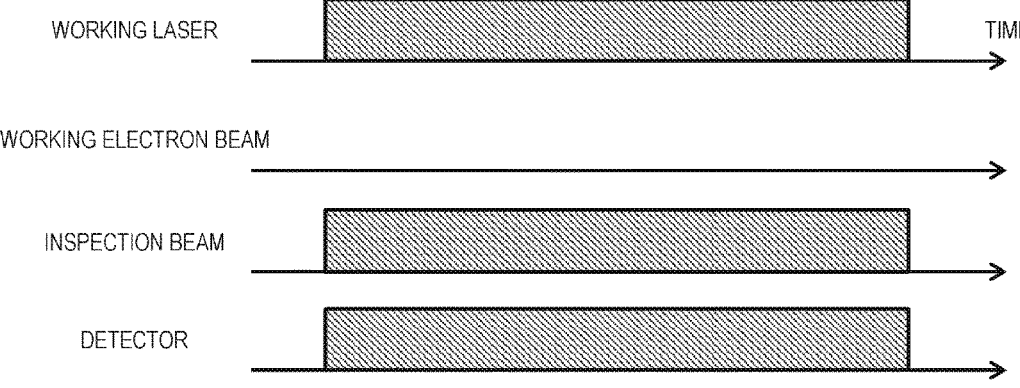
FIG. 9C     ELECTRICAL CHARACTERISTIC MEASUREMENT
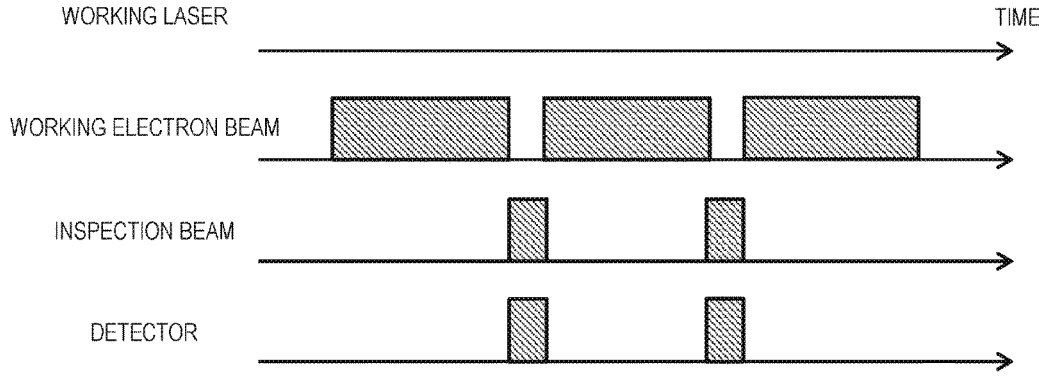

[FIG. 10]
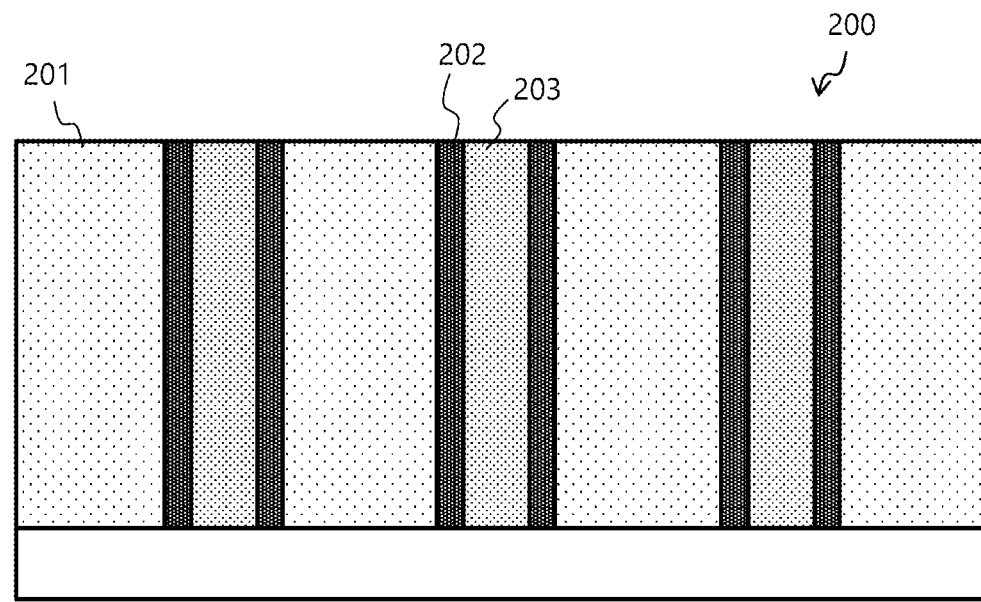

FIG. 11A          DIMENSION MEASUREMENT
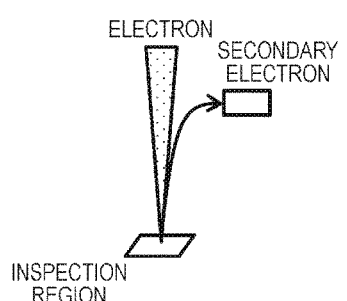
SECONDARY ELECTRON IMAGE
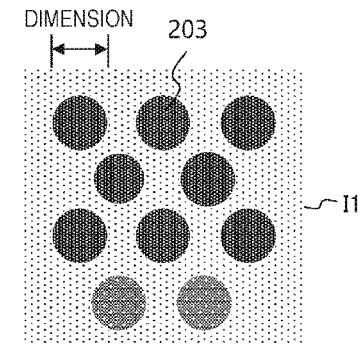
FIG. 11B
MATERIAL CHARACTERISTIC MEASUREMENT
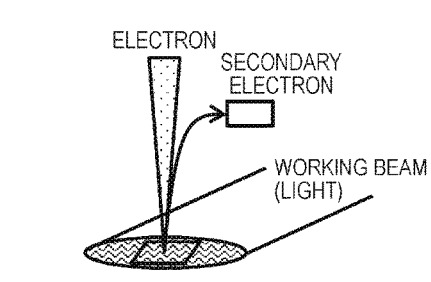
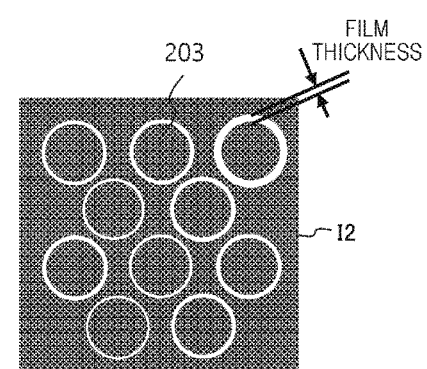
FIG. 11C          ELECTRICAL CHARACTERISTIC MEASUREMENT
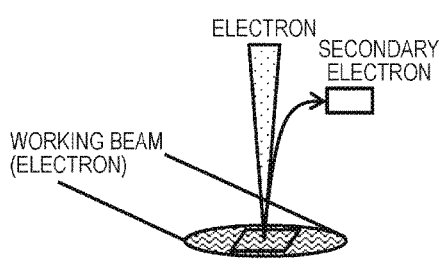
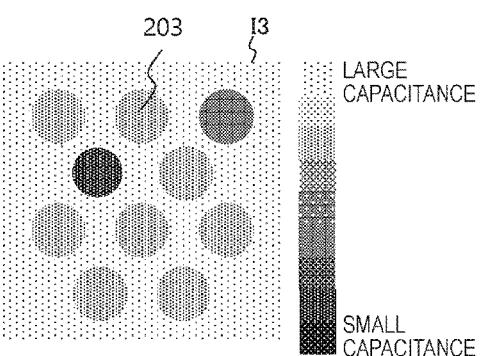

NUMBER IS ID

203

| ID | DIMENSION | CAPACITANCE | FILM THICKNESS |
|---|---|---|---|
| 1 | 0.124 µm | 27 fF | 2.12 nm |
| 2 | 0.131 µm | 23 fF | 2.18 nm |
| 3 | 0.139 µm | 14 fF | 3.92 nm |
| 4 | 0.092 µm | 10 fF | 2.41 nm |
| ⋮ | ⋮ | ⋮ | ⋮ |
| 10 | 0.128 µm | 22 fF | 2.24 nm |

[FIG. 14]

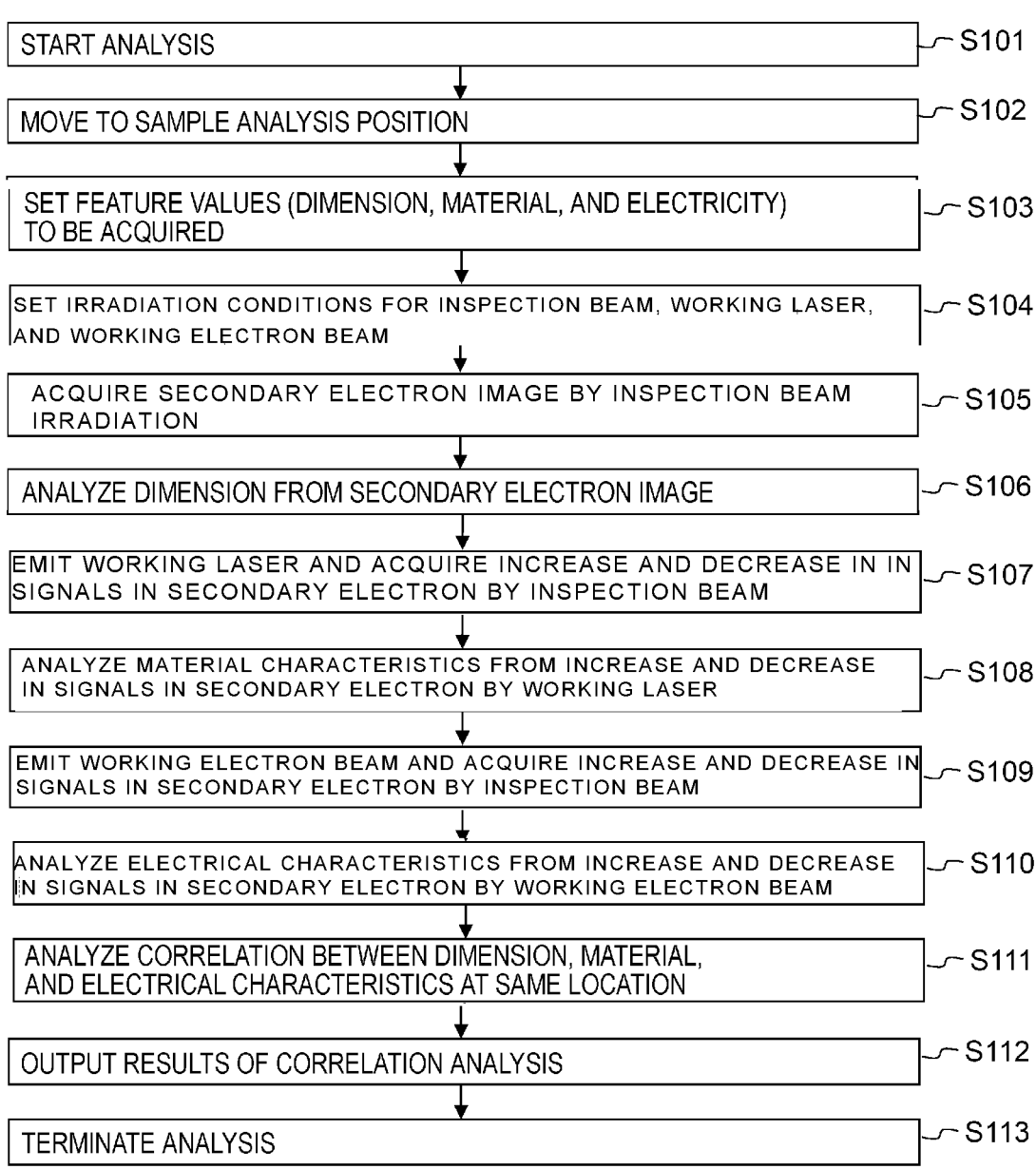

| START ANALYSIS | S101 |
| MOVE TO SAMPLE ANALYSIS POSITION | S102 |
| SET FEATURE VALUES (DIMENSION, MATERIAL, AND ELECTRICITY) TO BE ACQUIRED | S103 |
| SET IRRADIATION CONDITIONS FOR INSPECTION BEAM, WORKING LASER, AND WORKING ELECTRON BEAM | S104 |
| ACQUIRE SECONDARY ELECTRON IMAGE BY INSPECTION BEAM IRRADIATION | S105 |
| ANALYZE DIMENSION FROM SECONDARY ELECTRON IMAGE | S106 |
| EMIT WORKING LASER AND ACQUIRE INCREASE AND DECREASE IN IN SIGNALS IN SECONDARY ELECTRON BY INSPECTION BEAM | S107 |
| ANALYZE MATERIAL CHARACTERISTICS FROM INCREASE AND DECREASE IN SIGNALS IN SECONDARY ELECTRON BY WORKING LASER | S108 |
| EMIT WORKING ELECTRON BEAM AND ACQUIRE INCREASE AND DECREASE IN SIGNALS IN SECONDARY ELECTRON BY INSPECTION BEAM | S109 |
| ANALYZE ELECTRICAL CHARACTERISTICS FROM INCREASE AND DECREASE IN SIGNALS IN SECONDARY ELECTRON BY WORKING ELECTRON BEAM | S110 |
| ANALYZE CORRELATION BETWEEN DIMENSION, MATERIAL, AND ELECTRICAL CHARACTERISTICS AT SAME LOCATION | S111 |
| OUTPUT RESULTS OF CORRELATION ANALYSIS | S112 |
| TERMINATE ANALYSIS | S113 |

[FIG. 15]

[FIG. 16]
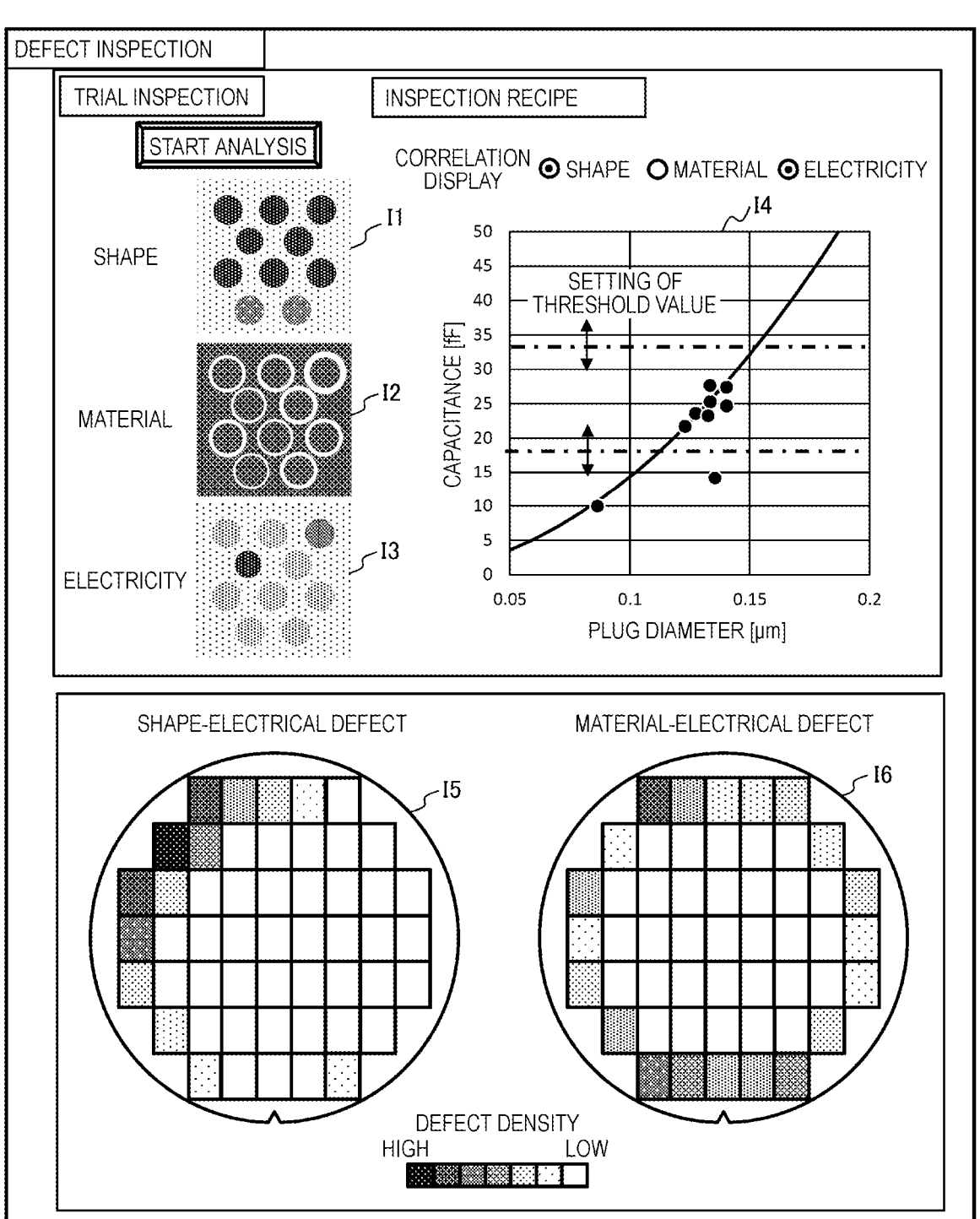

[FIG. 17]
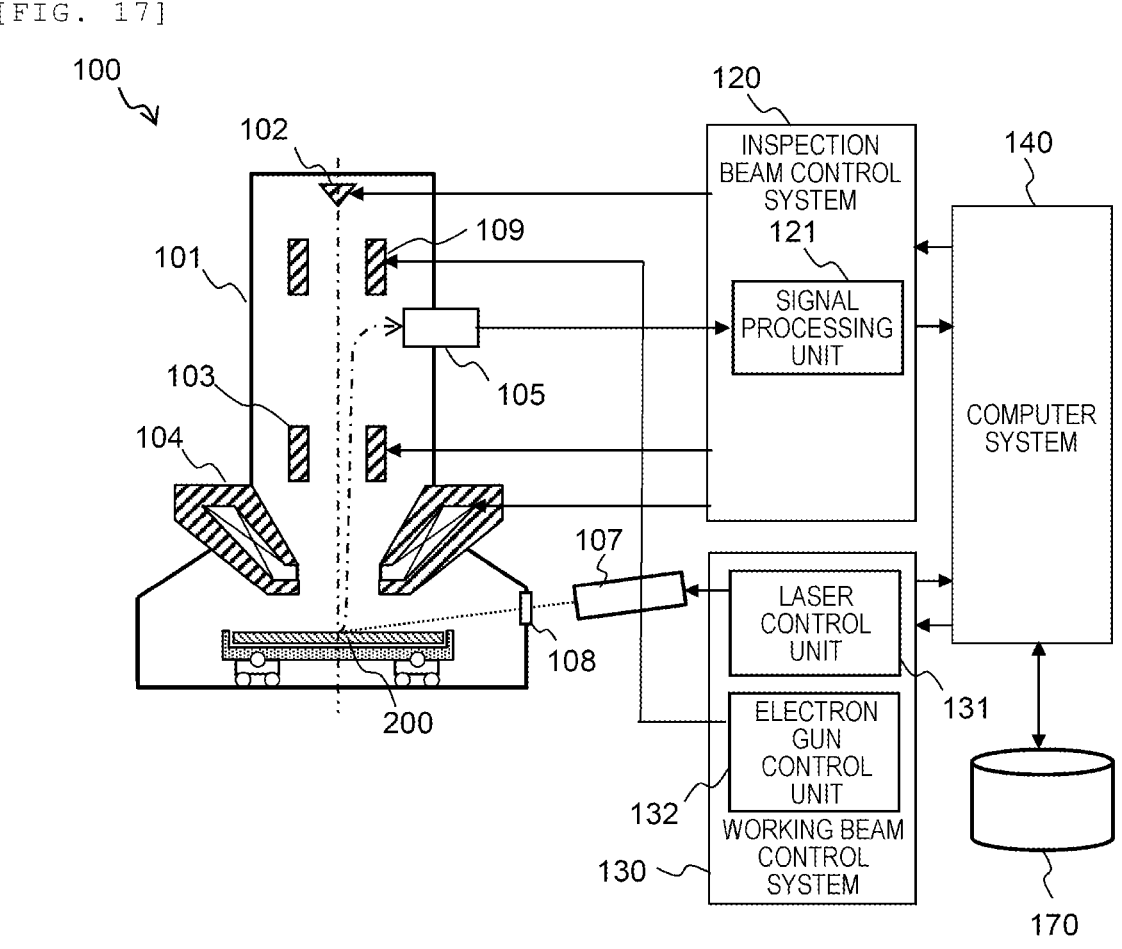

FIG. 18A
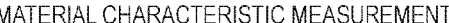
MATERIAL CHARACTERISTIC MEASUREMENT
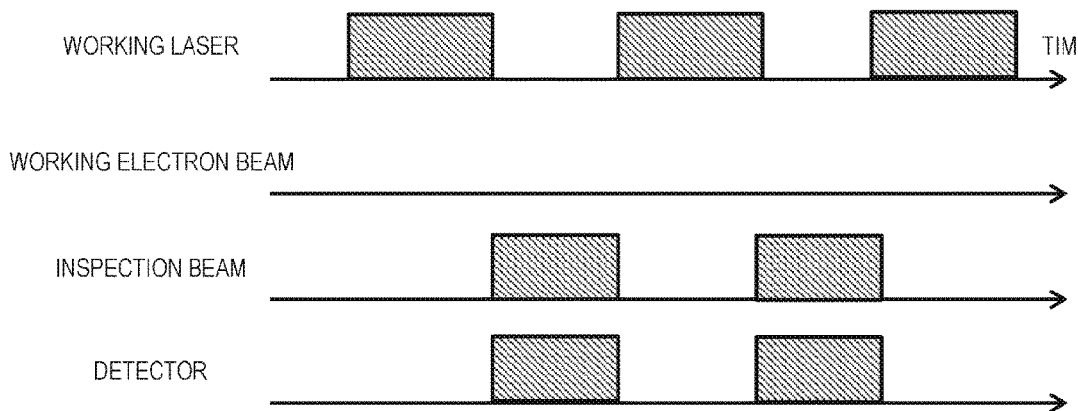
FIG. 18B   ELECTRICAL CHARACTERISTIC MEASUREMENT
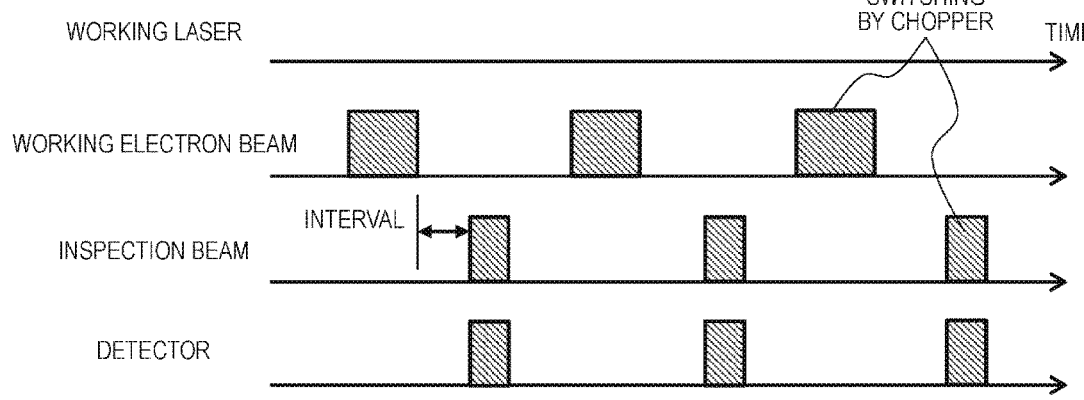

FIG. 19A          PROCESS A : DEPOSITION + ETCHING
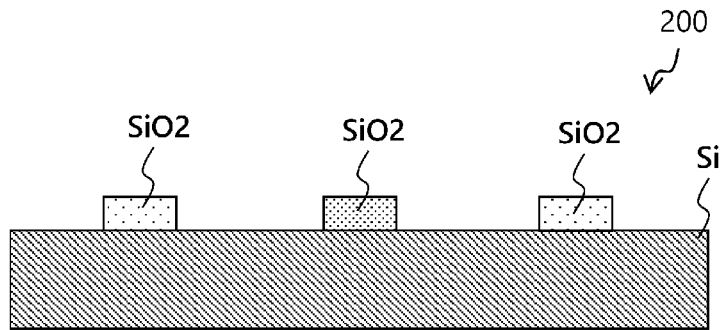
FIG. 19B          PROCESS B : DEPOSITION + ETCHING + ANNEALING
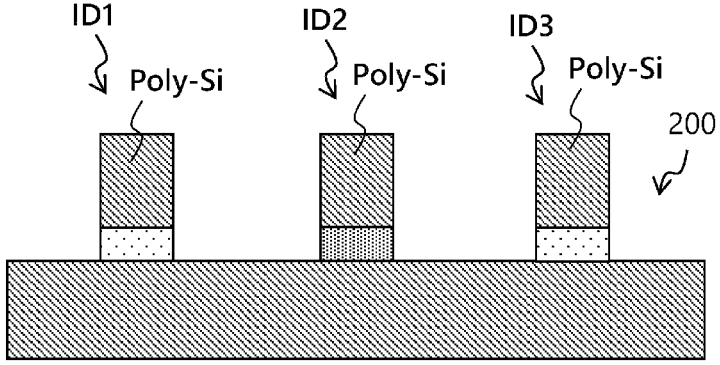

PROCESS A
FIG. 20A    MATERIAL CHARACTERISTIC
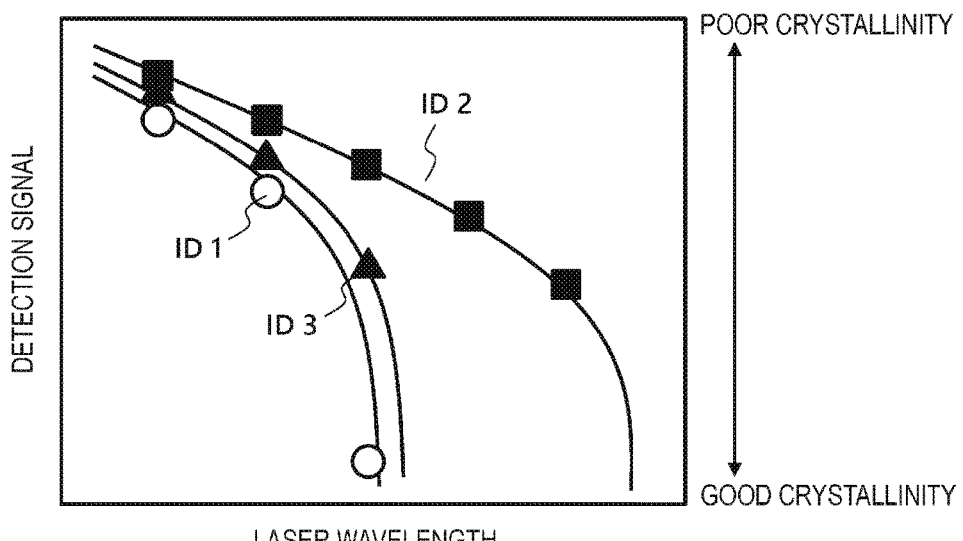
FIG. 20B    ELECTRICAL CHARACTERISTIC
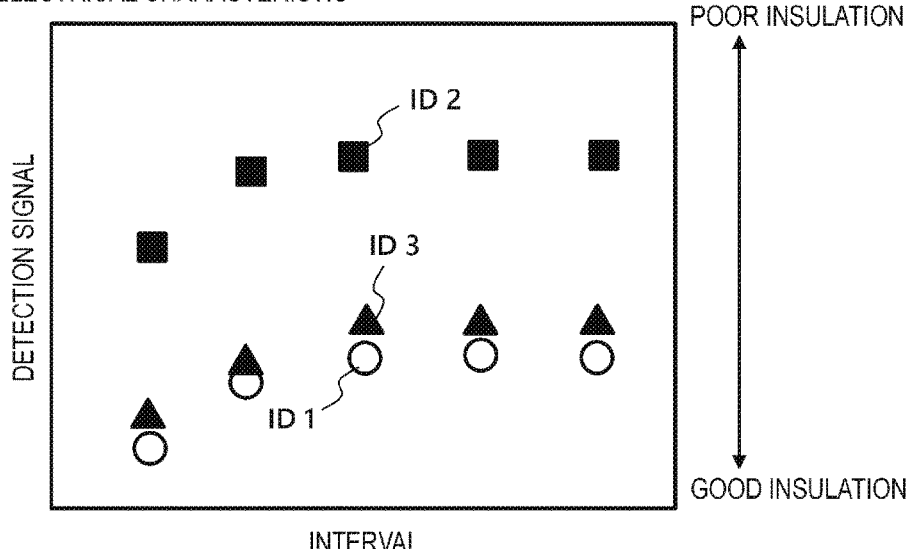

FIG. 21A
PROCESS B
MATERIAL CHARACTERISTIC
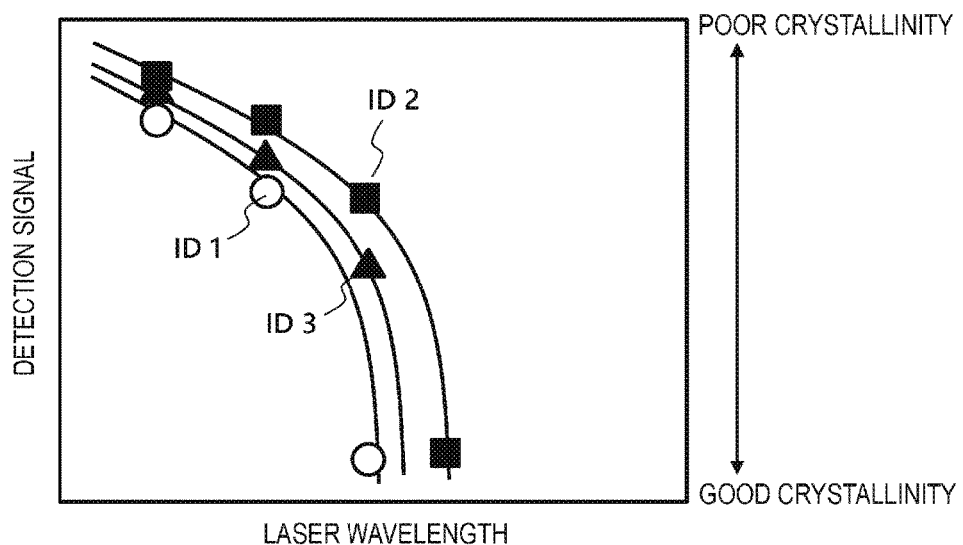
FIG. 21B    ELECTRICAL CHARACTERISTIC
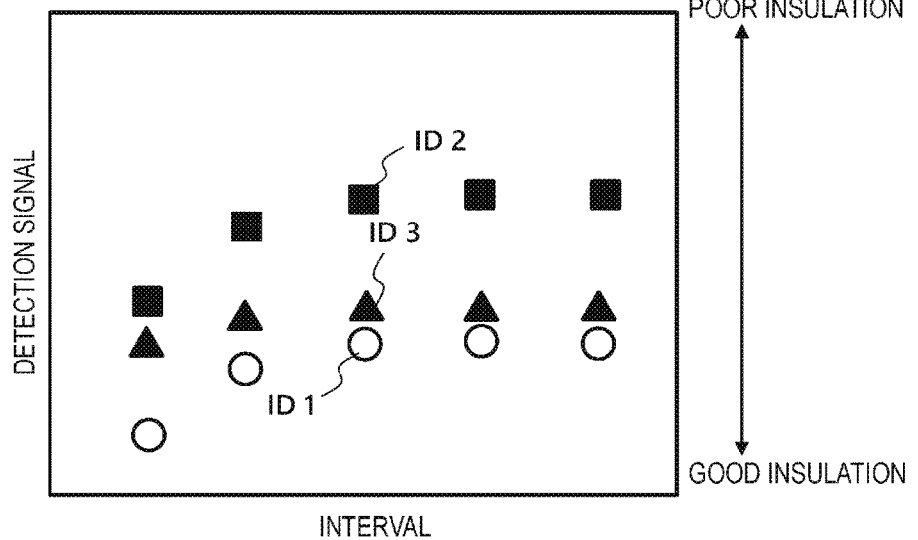

FIG. 22A    MATERIAL CHARACTERISTIC
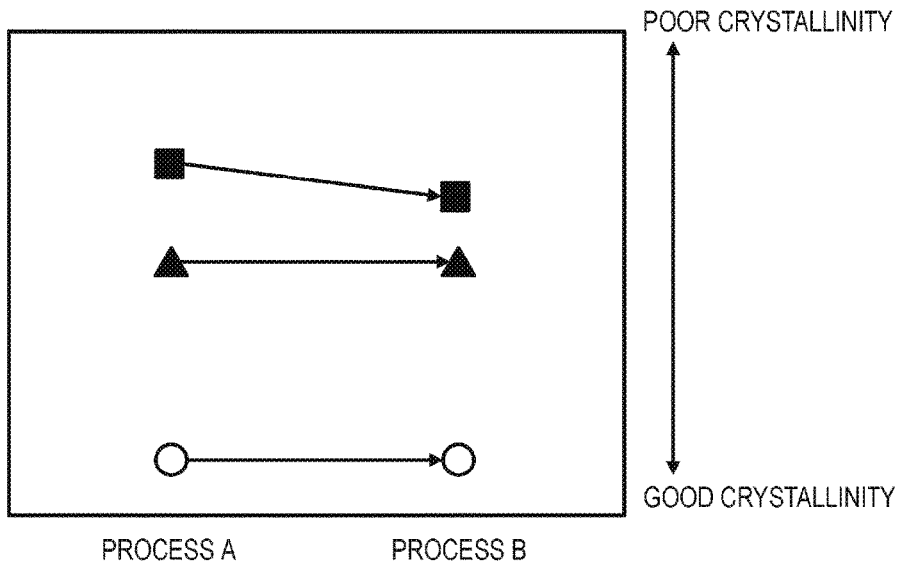
FIG. 22B    ELECTRICAL CHARACTERISTIC
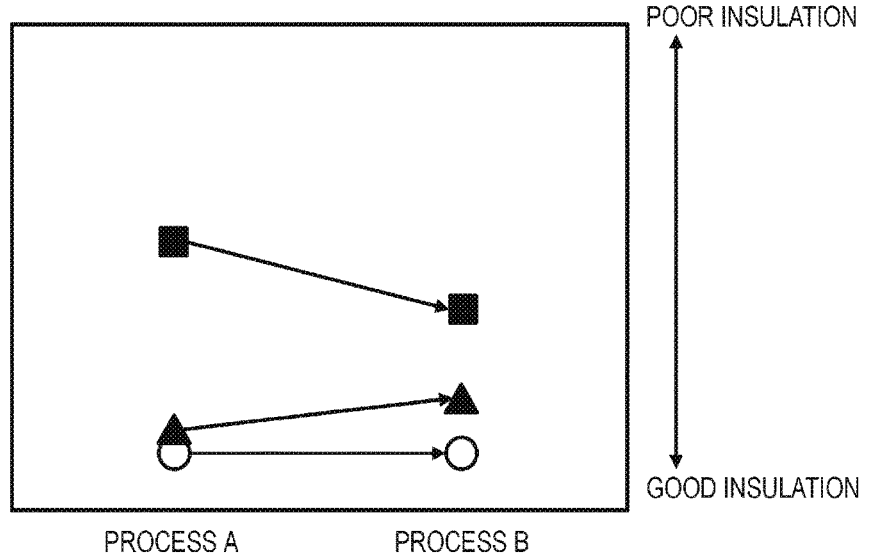

[FIG. 23]

FIG. 24A     PROCESS A                                    200

210

211

Si        SiO2

FIG. 24B     PROCESS B                                    200

212          211

Si        SiO2

FIG. 25A
MEASUREMENT IN PROCESS A
DIMENSION
FIG. 25B
MATERIAL CHARACTERISTIC
(CONTOUR)
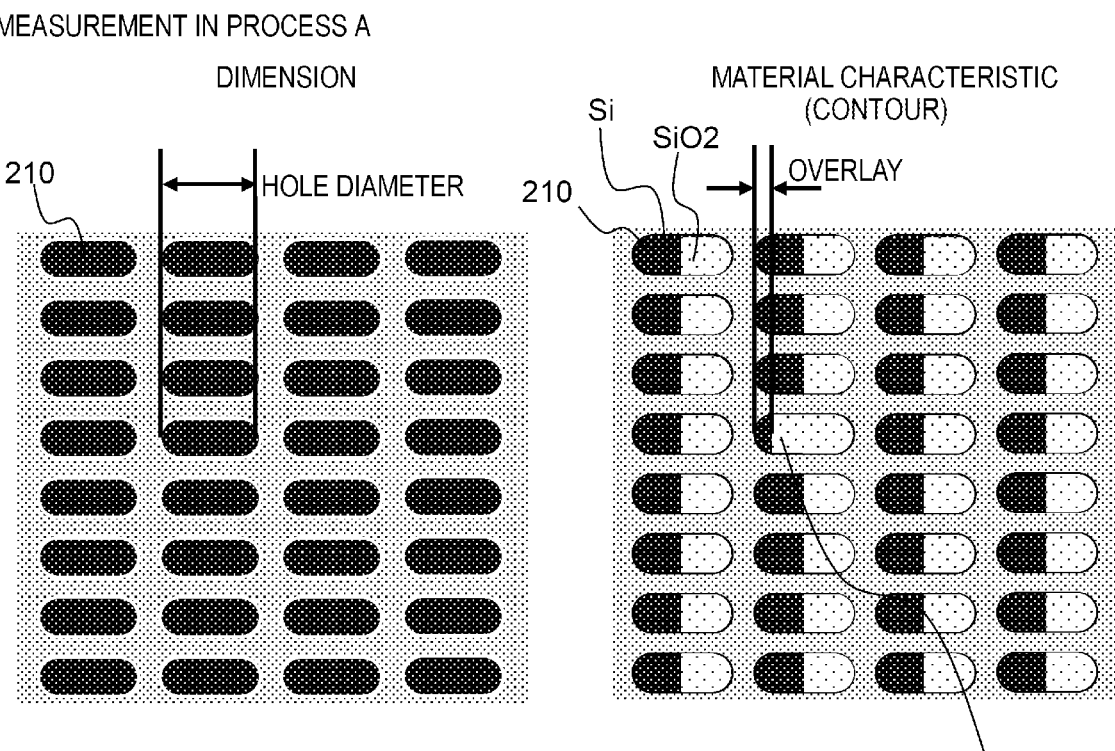
MEASUREMENT IN PROCESS B
ELECTRICAL CHARACTERISTIC
FIG. 25C
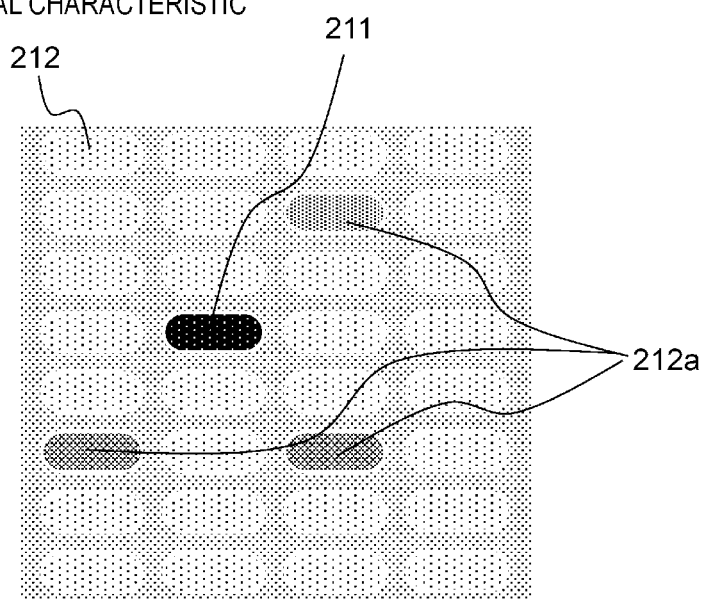

FIG. 26A
FIG. 26B
DEFECT CLASSIFICATION RECIPE
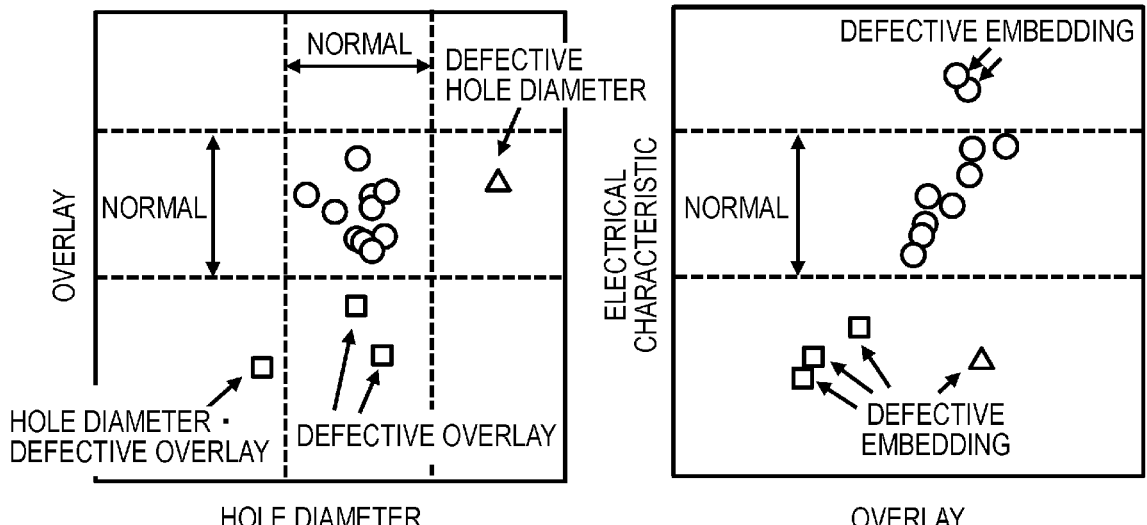
DEFECT CLASSIFICATION RESULT
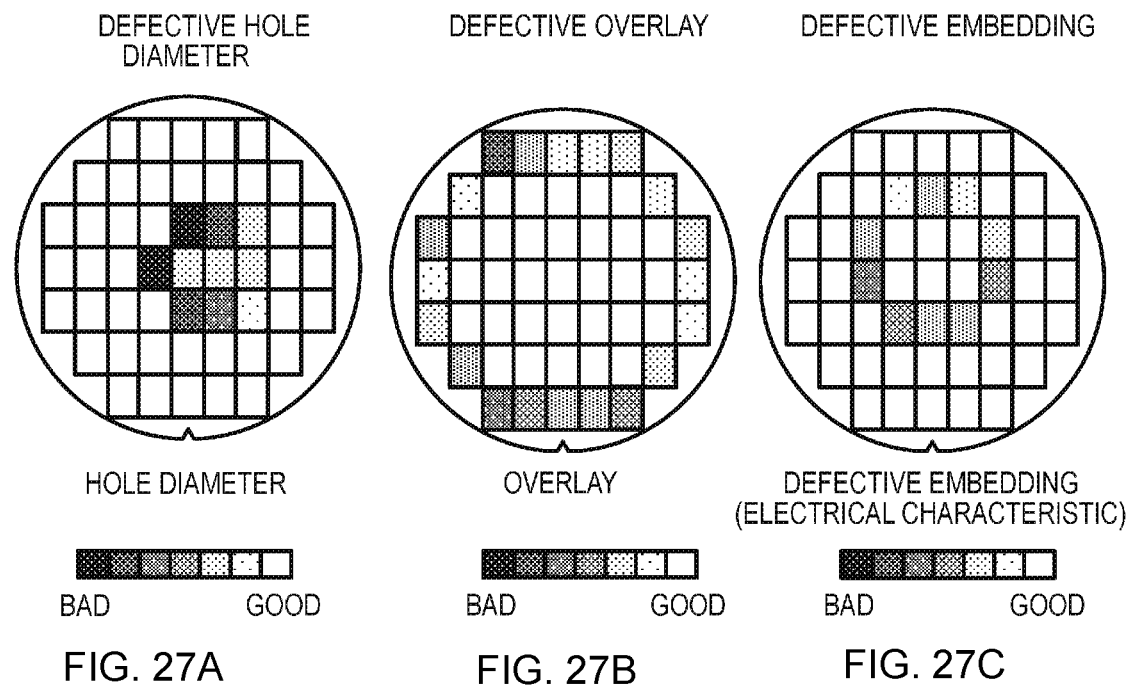
FIG. 27A
FIG. 27B
FIG. 27C FIG. 29A
RC TIME CONSTANT (WORKING ELECTRON BEAM)
PERFORMANCE SPECIFICATION
DIMENSION [nm]
FIG. 29B
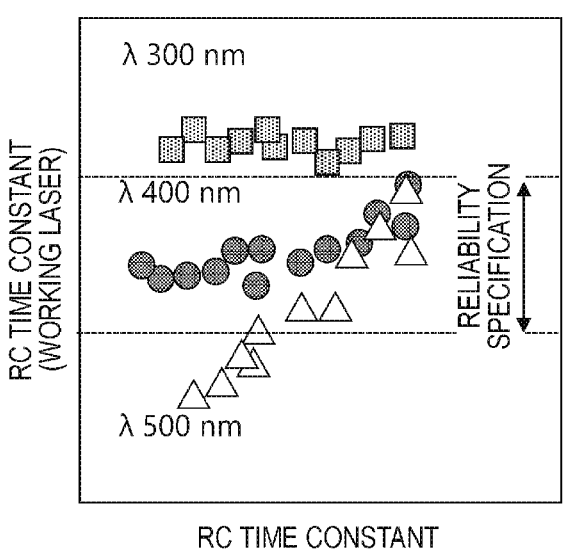
λ 300 nm
λ 400 nm
λ 500 nm
RC TIME CONSTANT (WORKING LASER)
RELIABILITY SPECIFICATION
RC TIME CONSTANT (WORKING ELECTRON BEAM)
FIG. 29C
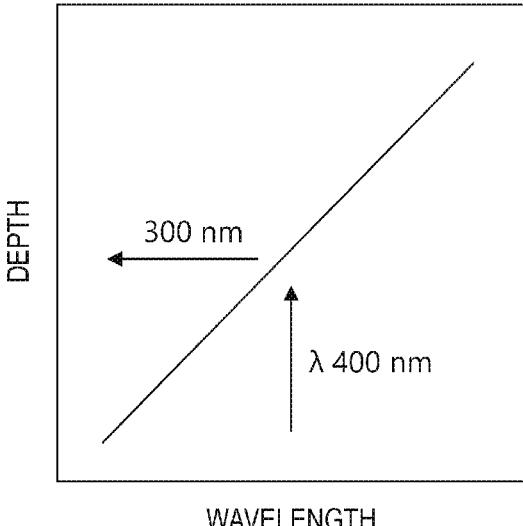
DEPTH
300 nm
λ 400 nm
WAVELENGTH

CROSS-SECTIONAL VIEW

TOP VIEW

FIRST INSPECTION IMAGE

RESULT OF DIMENSION MEASUREMENT

IIMAGE WHEN FILM THICKNESS IS MEASURED
(S POLARIZATION)

IMAGE WHEN FILM THICKNESS IS MEASURED
(P POLARIZATION)

RESULT OF IMAGE BRIGHTNESS ANALYSIS
IN FILM THICKNESS MEASUREMENT

[FIG. 33]
|  | LIGHT ABSORPTION PER UNIT FILM THICKNESS (S POLARIZATION OF WAVELENGTH 350 nm) | LIGHT ABSORPTION PER UNIT FILM THICKNESS (P POLARIZATION OF WAVELENGTH 350 nm) |
|---|---|---|
| SiO | 1 mW/nm | 5 mW/nm |
| SiN | 3 mW/nm | 20 mW/nm |
[FIG. 34]
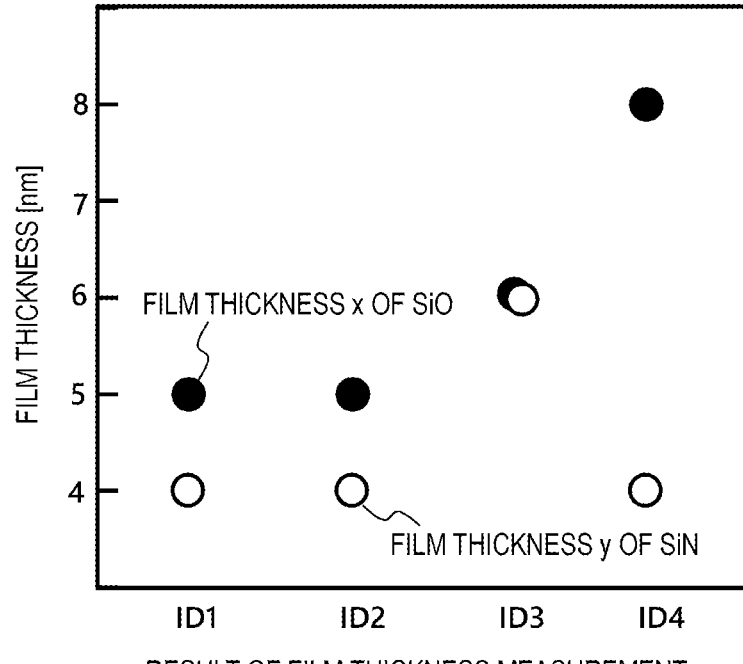
RESULT OF FILM THICKNESS MEASUREMENT

IMAGE WHEN ELECTRICAL
CHARACTERISTIC IS MEASURED

MEASUREMENT RESULT OF
ELECTRICAL CHARACTERISTIC

INSPECTION SYSTEM

TECHNICAL FIELD

The present disclosure relates to an inspection system.

BACKGROUND ART

As higher environmental resistance and reliability are required for semiconductor devices, process optimization considering electrical and material characteristics in addition to machining dimensions has become important in a manufacturing process. In addition, different machining treatments such as heat and damage are performed for each machining process, and thus the electrical and material characteristics change as the machining process progresses. The dimensions, electrical characteristics, and material characteristics of the semiconductor device are correlated with each other, and tracing the dimensions, electrical characteristics, and material characteristics that change for each machining process is useful for managing the performance of the semiconductor device.

In the inspection of a sample such as the semiconductor device, SEM capable of non-contact measurement and having high spatial resolution has been widely used for in-line dimension measurement. Further, contact probe measurement is generally used to measure electrical characteristics, and optical measurement is generally used to measure material characteristics. Each measurement method has different measurement features such as contact or non-contact, and different spatial resolutions, and thus it is difficult to analyze a local correlation (for example, correlation between dimensions, electrical characteristics and material characteristics at the same location). In addition, each measurement method is applicable to different processes, and thus it is difficult to trace changes in characteristics between the different processes.

An example of a method of performing non-contact analysis on a plurality of characteristics with the same device is disclosed in JP2004-513509A (PTL 1). In the technique disclosed in PTL 1, a plurality of energy sources, such as light, electrons, ions, and X-rays, and a plurality of detector systems provided for the plurality of energy sources are provided, and CD and overlay are measured from electrical and material characteristics obtained by the plurality of energy sources and detector systems.

CITATION LIST

Patent Literature

PTL 1: JP2004-513509A

SUMMARY OF INVENTION

Technical Problem

However, the related art has a problem that it is difficult to analyze a correlation between a plurality of characteristics at the same location.

For example, the method disclosed in PTL 1 is a non-contact measurement method, but it is extremely difficult to analyze the correlation between the plurality of characteristics at the same location because energy sources have different spatial resolutions.

The present disclosure has been made to solve such a problem, and an object thereof is to provide an inspection system that makes it easier to analyze the correlation between the plurality of characteristics at the same location.

Solution to Problem

An example of an inspection system according to the present disclosure includes an inspection beam irradiation system that irradiates a sample with an inspection beam which is a charged particle beam, a detector that detects secondary charged particles obtained by irradiating the sample with the inspection beam and outputs a detection signal, a first working beam irradiation system that emits a first working beam for changing an amount of the secondary charged particles, a second working beam irradiation system that emits a second working beam for changing the amount of the secondary charged particles, and a computer system that generates an image of the sample based on the detection signal, in which the computer system generates a first inspection image related to irradiation with the inspection beam, acquires a first feature value regarding patterns on the sample based on the first inspection image, generates a second inspection image related to irradiation with the first working beam and the inspection beam, acquires a second feature value regarding the patterns based on the second inspection image, generates a third inspection image related to irradiation with the second working beam and the inspection beam, and acquires a third feature value regarding the patterns based on the third inspection image.

Advantageous Effects of Invention

According to an inspection system according to the present disclosure, it becomes easier to analyze a correlation between a plurality of characteristics at the same location.

BRIEF DESCRIPTION OF DRAWINGS

FIG. 1 is a diagram illustrating a state where a first working beam is used in a principle of the present disclosure.

FIG. 2 is a diagram illustrating an example of a structure of a sample.

FIG. 3 is a diagram illustrating an example of a relationship between a wavelength of a working laser and an amount of secondary electrons detected.

FIG. 4 is a diagram illustrating a state where a second working beam is used.

FIG. 5 is a diagram illustrating an example of a relationship between an amount of working electron beams emitted and the amount of the secondary electrons detected.

FIG. 6 is a diagram illustrating an example of a relationship between electrical characteristics and materials.

FIG. 7 is a diagram illustrating a configuration of an inspection system according to a first embodiment.

FIG. 8 is a diagram illustrating a configuration of a computer system according to the first embodiment.

FIGS. 9A to 9C are diagrams illustrating an irradiation timing of each beam by the inspection system according to the first embodiment.

FIG. 10 is a diagram illustrating a specific example of a sample measured by the inspection system according to the first embodiment.

FIGS. 11A to 11C are diagrams illustrating a specific example of an inspection image generated by the inspection system according to the first embodiment.

FIG. 14 is a flowchart illustrating an operation example of the inspection system according to the first embodiment.

FIG. 15 is a diagram illustrating an example of a user interface (UI) screen for setting feature values to be acquired, according to the first embodiment.

FIG. 16 is a diagram illustrating an example of a UI screen output in relation to the processing of FIG. 15.

FIG. 17 is a diagram illustrating a configuration of an inspection system according to a second embodiment.

FIGS. 18A and 18B are diagrams illustrating an irradiation timing of each working beam according to the second embodiment.

FIGS. 19A and 19B are diagrams illustrating a specific example of a sample according to the second embodiment.

FIGS. 20A and 20B are diagrams illustrating an example of measurement results immediately after a process A, according to the second embodiment.

FIGS. 21A and 21B are diagrams illustrating an example of measurement results immediately after a process B, according to the second embodiment.

FIGS. 22A and 22B are diagrams illustrating an example of changes in feature values as the processes progress, according to the second embodiment.

FIG. 23 is a diagram illustrating a configuration of an inspection system according to a third embodiment.

FIGS. 24A and 24B are diagrams illustrating a specific example of a sample according to the third embodiment.

FIGS. 25A to 25C are diagrams illustrating measurement results according to the third embodiment.

FIGS. 26A and 26B are diagrams illustrating an example of results of pattern classification according to the third embodiment.

FIGS. 27A to 27C are diagrams illustrating another example of the results of the pattern classification according to the third embodiment.

FIGS. 29A to 29C are diagrams illustrating a principle of a method for controlling an implant depth using an inspection system according to the fourth embodiment.

FIG. 33 is a diagram illustrating a specific example of light absorbance, according to the fifth embodiment.

FIG. 34 is a diagram illustrating an example of calculation results of film thicknesses x and y, according to the fifth embodiment.

DESCRIPTION OF EMBODIMENTS

Figures 12A, 12B:
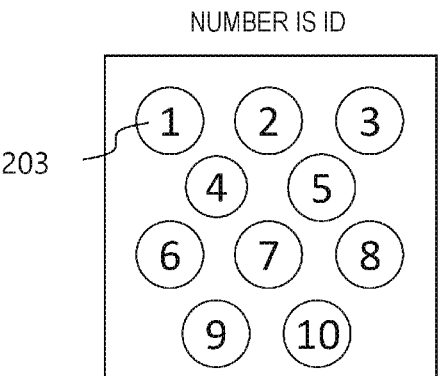
FIGS. 12A and 12B are diagrams illustrating an example of analysis of a correlation between a plurality of characteristics at the same location, according to the first embodiment.

First, an example of a principle of the present disclosure will be described with reference to FIGS. 1 to 6. An inspection system according to the present disclosure uses an inspection beam (for example, an electron beam) and a plurality of working beams. The working beam changes (that is, increases or decreases) an amount of secondary electrons obtained by irradiation with the inspection beam.

FIG. 1 illustrates a state where a first working beam is used. An irradiation region 300 is irradiated with a laser B2 as the first working beam. A sample 200 is disposed in the irradiation region 300, and the sample 200 is irradiated with the laser B2. The sample 200 is irradiated with an inspection beam B1 during or after irradiation with the laser B2. As a result, secondary electrons B4 discharged from the sample 200 are detected by a detector 105.

FIG. 2 illustrates an example of a structure of the sample 200. Patterns P1 to P3 are formed on the sample 200 as physical structures.

By irradiating the sample 200 with the laser B2, carriers are excited in accordance with material characteristics (for example, photo absorption coefficient) of the sample 200, and the secondary electrons B4 to be discharged increase or decrease. Since a change amount of the secondary electrons B4 depends on a wavelength of light, the material characteristics of the sample 200 can be specified based on the dependence.

FIG. 3 illustrates an example of a relationship between a wavelength of a working laser and an amount of secondary electrons detected. The amount of the secondary electrons detected corresponds to material characteristics (photo absorption coefficient in this example). Since the amount of the secondary electrons detected changes in accordance with the wavelength of a laser, material characteristics can be measured based on the state of the change. For example, by comparing the measurement results as illustrated in FIG. 3 with data measured for various materials, it can be specified that the pattern P1 is formed of SiO, the pattern P2 is formed of SiON, and the pattern P3 is formed of SiN.

FIG. 4 illustrates a state where a second working beam is used. The sample 200 is irradiated with an electron beam B3 as the second working beam. The sample 200 is irradiated with the inspection beam B1 during or after irradiation with the electron beam B3. As a result, the secondary electrons B4 discharged from the sample 200 are detected by the detector 105.

By irradiating the sample 200 with the electron beam B3, a surface voltage of the sample 200 changes in accordance with electrical characteristics of a material of the sample 200, and the secondary electrons B4 to be discharged increase or decrease. Since the change amount of the secondary electrons B4 depends on the electrical characteristics, electrical characteristics of the sample 200 can be specified based on the dependence.

FIG. 5 illustrates an example of a relationship between the amount of working electron beams emitted (for example, charge) and the amount of the secondary electrons detected. The amount of the secondary electrons detected corresponds to electrical characteristics (surface voltage during measurement in this example). Since the amount of the secondary electrons detected changes in accordance with the amount of electron beams emitted, the electrical characteristics can be measured based on the state of the change. For example, it can be specified that the pattern P1 has a large capacitance and a medium resistance, the pattern P2 has a medium capacitance and a low resistance, and the pattern P3 has a small capacitance and a large resistance.

FIG. 6 illustrates an example of a relationship between electrical characteristics and materials. Based on the electrical characteristics described in FIG. 5, it can be specified that, for example, the pattern P1 is formed of SiO, the pattern P2 is formed of SiON, and the pattern P3 is formed of SiN.

Note that it is also possible to analyze such a correlation between material characteristics and electrical characteristics and determine whether each pattern is good or bad based on the correlation results.

Hereinafter, embodiments of the present disclosure will be described based on the accompanying drawings.

First Embodiment

FIG. 7 illustrates a configuration of an inspection system 100 according to a first embodiment. The inspection system 100 includes a housing 101, an electron source 102, a deflector 103, an objective lens 104, a detector 105, an electron gun 106, a laser device 107, a window 108, an inspection beam control system 120, a working beam control system 130, and a computer system 140.

The electron source 102 functions as an inspection beam irradiation system, and irradiates the sample 200 with an inspection beam which is a charged particle beam. The deflector 103 and the objective lens 104 deflect the inspection beam so as to be emitted to a desired location in the sample 200. Secondary charged particles (electrons in the present embodiment, hereinafter referred to as "secondary electrons") are obtained by irradiating the sample 200 with the inspection beam. The detector 105 detects the secondary electrons and outputs a detection signal.

The laser device 107 functions as a first working beam irradiation system and irradiates the sample 200 with a first working beam. In the present embodiment, the first working beam is a laser and may be hereinafter referred to as a "working laser". The working laser changes an amount of the secondary electrons.

The electron gun 106 functions as a second working beam irradiation system and irradiates the sample 200 with a second working beam. In the present embodiment, the second working beam is an electron beam and may be hereinafter referred to as a "working electron beam". The working electron beam changes the amount of the secondary electrons.

The inspection beam control system 120 operates based on an instruction received from the computer system 140. The inspection beam control system 120 controls the electron source 102, the deflector 103, and the objective lens 104 to emit an inspection beam. The inspection beam control system 120 also includes a signal processing unit 121. The signal processing unit 121 receives the detection signal from the detector 105, converts the format thereof, and transmits the signal to the computer system 140.

The working beam control system 130 operates based on an instruction received from the computer system 140. The working beam control system 130 includes a laser control unit 131 and an electron gun control unit 132. The laser control unit 131 controls the laser device 107 to emit a working laser. The electron gun control unit 132 controls the electron gun 106 to emit a working electron beam. The window 108 makes at least a portion (preferably substantially all) of the working laser pass through.

FIG. 8 illustrates a configuration of the computer system 140. The computer system 140 can be configured to include a known computer and includes, for example, a computation means and a storage means. The computation means includes, for example, a processor, and the storage means includes, for example, storage media such as a semiconductor memory device and a magnetic disk device. Some or all of the storage media may be non-transitory storage media.

The storage means may store programs. The computer system 140 may execute functions described in the present embodiment by the processor executing the programs.

The computer system 140 includes a feature value analysis system 150 and an operation/output system 160. The feature value analysis system 150 includes a correlation analysis unit 151, a dimension analysis unit 152, a material characteristic analysis unit 153, and an electrical characteristic analysis unit 154. The operation/output system 160 includes an input unit 161 and an output unit 162.

The input unit 161 includes an input device such as a keyboard and a mouse. In addition, the output unit 162 includes an output device such as a display and a printer. The input unit 161 and the output unit 162 may include a communication means such as a network interface.

FIG. 9 illustrates an irradiation timing of each beam by the inspection system 100. FIG. 9(*a*) illustrates an irradiation timing when dimensions are measured based on a first inspection image. Only an inspection beam is emitted, and a working electron beam and a working laser are not emitted. The detector operates while the inspection beam is emitted. An operation time of the detector may be shorter than an irradiation time of the inspection beam.

FIG. 9(*b*) illustrates an irradiation timing when material characteristics are measured based on a second inspection image. An inspection beam and a working laser are emitted, and a working electron beam is not emitted. The detector operates while the inspection beam and the working laser are emitted. An operation time of the detector may be shorter than an irradiation time of the inspection beam.

FIG. 9(*c*) illustrates an irradiation timing when electrical characteristics are measured based on a third inspection image. An inspection beam and a working electron beam are emitted, and a working laser is not emitted. In addition, the working electron beam and the inspection beam are emitted such that an irradiation timing of the working electron beam and an irradiation timing of the inspection beam do not overlap each other. The detector operates only while the inspection beam is emitted, and does not operate while the working electron beam is emitted.

In the example illustrated in FIG. 9(*c*), the working electron beam is emitted in a pulse shape instead of being emitted continuously. In addition, pulses of the working electron beams and pulses of the inspection beams are emitted alternately. In this manner, it becomes easy to control the amount of the working electron beams emitted (current x time=charge) by controlling current and time of the pulses of the working electron beams.

FIG. 10 illustrates a specific example of the sample 200 measured by the inspection system 100. The sample 200 includes an interlayer film 201, a gate insulator 202, and a plug 203.

FIG. 11 illustrates a specific example of an inspection image generated by the inspection system 100. This example corresponds to the structure of FIG. 10. An image I1 in FIG. 11(*a*) is an example of the first inspection image used for dimension measurement. The image I1 is an inspection image related to irradiation with the inspection beam. The computer system 140 (for example, the dimension analysis unit 152) emits the inspection beam to generate the image I1, and acquires a first feature value (a diameter of each plug 203 in this example) regarding a pattern on the sample 200 based on the image I1.

An image I2 in FIG. 11(*b*) is an example of the second inspection image used to measure material characteristics. The image I2 is an inspection image related to irradiation with the working laser and the inspection beam. The computer system 140 (for example, the material characteristic analysis unit 153) emits the working laser and the inspection beam to generate the image I2, and acquires a second feature value (a film thickness of each plug 203 in this example) regarding a pattern based on the image I2. Note that the amount of the secondary electrons changes due to the irradiation with the working laser, the image I2 is an image different from the image I1, and a film thickness of each plug 203, which is difficult to measure only with the image I1, can be measured.

Note that a relationship between conditions of the working laser and the number of the secondary electrons emitted is described in, for example, WO2020/053967.

An image I3 in FIG. 11(*c*) is an example of the third inspection image used to measure electrical characteristics. The image I3 is an inspection image related to irradiation with the working electron beam and the inspection beam. The computer system 140 (for example, the electrical characteristic analysis unit 154) emits the working electron beam and the inspection beam to generate the image I3, and acquires a third feature value (a capacitance of each plug 203 in this example) regarding a pattern based on the image I3. Note that the amount of the secondary electrons changes due to the irradiation with the working electron beam, the image I3 is an image different from the image I1, and the capacitance of each plug 203, which is difficult to measure only with the image I1, can be measured.

A specific method for acquiring the feature values based on the images I1 to I3 can be appropriately designed by a person skilled in the art. For example, the diameter and film thickness of the plug 203 can be calculated using an image processing technique. In addition, the capacitance of the plug 203 can be calculated based on the amount or a change amount (the change amount between the image I1 and the image I3) of the secondary electrons.

FIG. 12 illustrates an example of analysis of a correlation between a plurality of characteristics at the same location. As illustrated in FIG. 12(*a*), each plug 203 can be identified based on the image I1. In FIG. 12(*a*), each plug 203 is identified by being given 1 to 10 as an identifier (ID). Further, by aligning the three images I1 to I3 illustrated in FIG. 11, each characteristic can be associated with each plug 203 as illustrated in FIG. 12(*b*). By using the information illustrated in FIG. 12(*b*), it becomes easier to analyze the correlation between the plurality of characteristics at the same location. For example, a plug 203 with an ID of 1 has a dimension of 0.124 μm, a capacitance of 27 fF, and a film thickness of 2.12 nm.

Figure 13A:
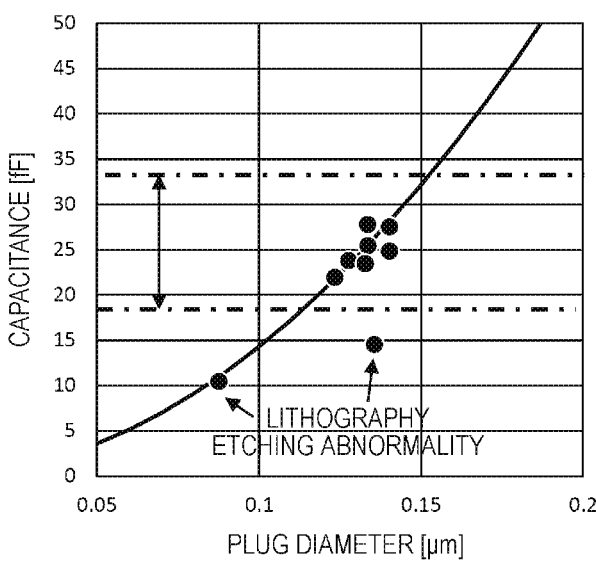
FIGS. 13A and 13B are diagrams illustrating an example of a method for detecting a defect of a pattern based on the analysis of the correlation, according to the first embodiment.
Figure 13B:
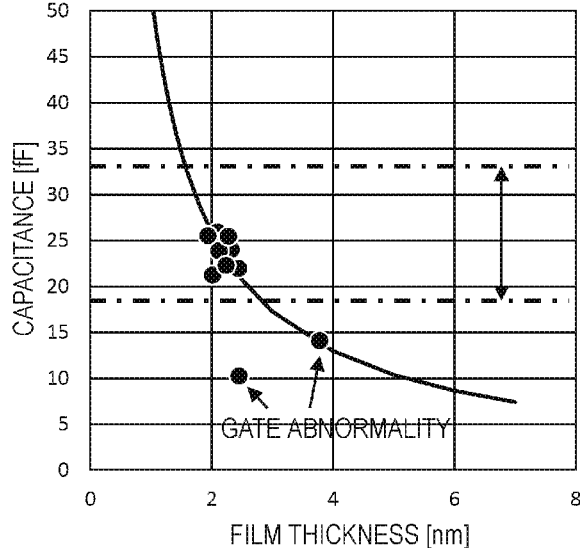

FIG. 13 illustrates an example of a method for detecting a defect of a pattern based on the analysis of the correlation. The computer system 140 may generate and output a graph illustrated in FIG. 13. FIG. 13(*a*) represents a correlation between the diameter and the capacitance of each plug. A double-headed arrow represents a normal range. Two plugs are out of the normal range. In these plugs, it can be considered that lithography etching abnormality occurs.

FIG. 13(*b*) illustrates a correlation between the film thickness and the capacitance of each plug. A double-headed arrow represents the normal range. Two plugs are out of the normal range. In these plugs, it can be considered that gate abnormality occurs.

In this manner, the computer system 140 can acquire information indicating the defect of the pattern based on at least one of the first, second, and third feature values (capacitance in the example of FIG. 13) and a predetermined threshold value (for example, upper and lower limits of the normal range). In this manner, a defect can be automatically detected.

FIG. 14 is a flowchart illustrating an operation example of the inspection system 100. The inspection system 100 starts analysis (step S101). Next, the computer system 140 controls the inspection beam control system 120 to move a position to be irradiated with the inspection beam to an appropriate position in the sample 200 (step S102). Next, the computer system 140 sets a feature value to be acquired (step S103).

Figure 15:
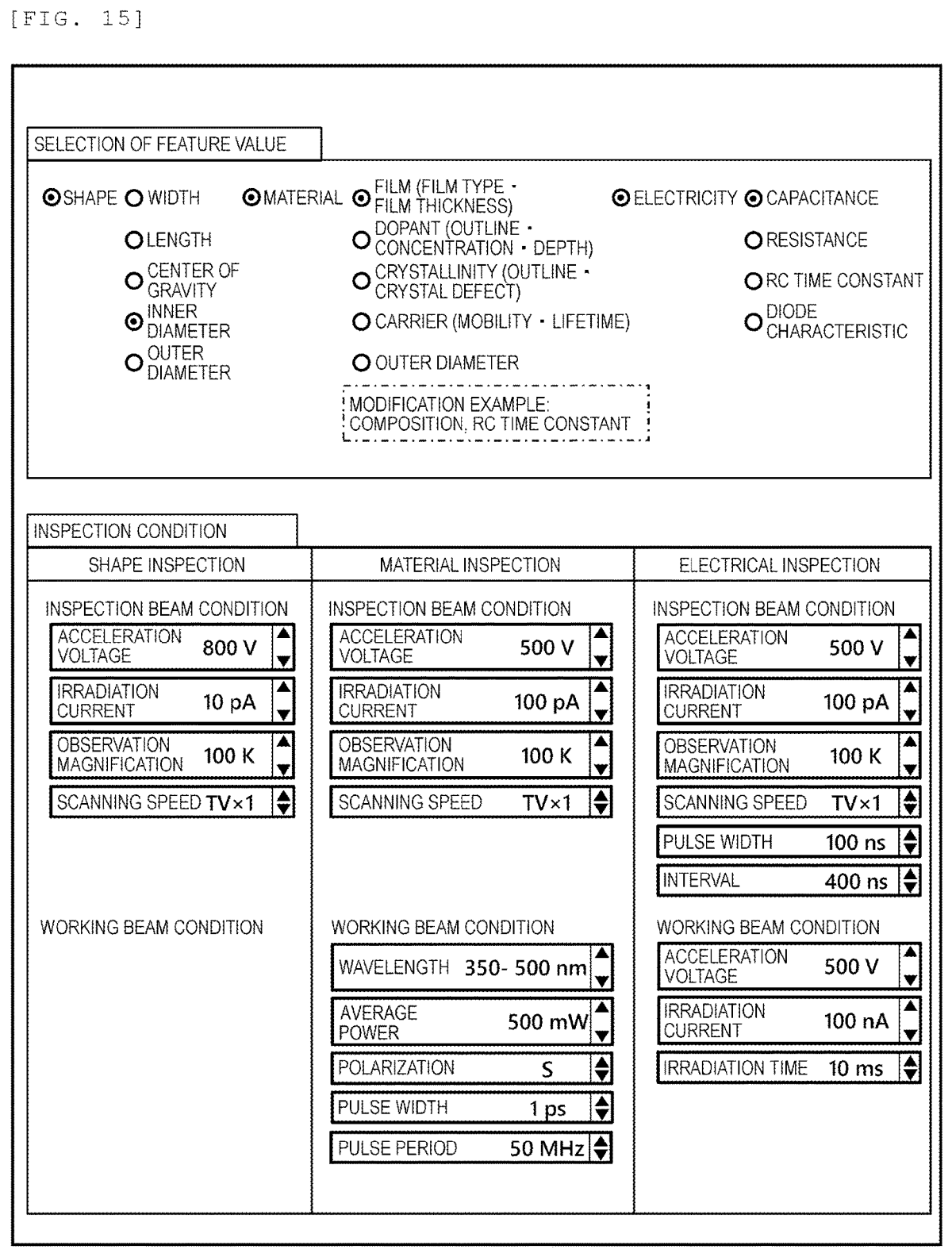

FIG. 15 illustrates an example of a user interface (UI) screen for setting the feature value to be acquired. As the first feature value, a feature value related to dimensions shown in the image I1 can be set. In the example of FIG. 15, the feature value related to the dimensions is shown as "shape", and one or more of the width, length, center of gravity, inner diameter, outer diameter, and the like of a pattern can be set. A user can freely designate these feature values.

By acquiring the feature value related to the dimensions shown in the image I1 in this manner, it becomes easy to specify the position or region of a pattern in a sample, and it becomes easier to analyze the correlation between the plurality of characteristics at the same location.

As the second feature value, a feature value related to material characteristics can be set. In the example of FIG. 15, the feature value related to material characteristics is shown as "material", and one or more pieces of information on a film (for example, a film type, a film thickness, a film configuration, and the like), information on a dopant, information on crystallinity, information on carriers, an outer diameter of a pattern, and the like can be set. Further, in a modification, a composition of a material and an RC time constant may be able to be set as the second feature value.

In the present embodiment, the "film thickness" includes a dimension that is shown in the image I2 (that is, a length that can be measured on the image) and/or a dimension that is not shown in the image I2 (that is, a length in a depth direction with respect to the image). The information on a dopant includes, for example, one or more of a dopant type, a dopant concentration, a dopant depth, a contour of a dopant region, and the like. The information on crystallinity includes information indicating whether the material is amorphous or polycrystalline. The information on carriers includes, for example, carrier mobility and/or carrier lifetime.

By acquiring the feature values related to the material characteristics in this manner, material characteristics of a pattern in a sample can be measured, and it becomes easier to analyze a correlation with other characteristics at the same location.

As the third feature value, a feature value related to electrical characteristics can be set. In the example of FIG. 15, the feature value related to electrical characteristics is shown as "electricity", and one or more of a capacitance, a resistance (electrical resistance), a time constant (for example, the RC time constant), diode characteristics (for example, I-V characteristic), and the like can be set. Specific definitions of these values can be appropriately determined by those skilled in the art, and for example, the resistance can be set to be a resistance between two appropriate points of each pattern.

By acquiring the feature values related to electrical characteristics in this manner, electrical characteristics of a pattern in a sample can be measured, and it becomes easier to analyze the correlation with other characteristics at the same location.

Returning back to FIG. 14, after step S103, the computer system 140 sets irradiation conditions for the inspection beam and each working beam (step S104). The UI in FIG. 15 is also used to set irradiation conditions. The user can freely designate the irradiation conditions.

As illustrated in FIG. 15, the irradiation conditions for the inspection beam include one or more of irradiation energy (for example, an acceleration voltage), an irradiation amount (for example, an irradiation current and/or an irradiation period), an irradiation region (for example, a field of view determined in accordance with an observation magnification), and a scanning speed, and the like. In addition, the inspection beam can also be emitted in a pulse shape, and in this case, the inspection conditions for the inspection beam may include a pulse width and/or an interval (which will be described below in relation to FIG. 18(*b*)).

As illustrated in FIG. 15, a configuration may be adopted in which the irradiation conditions for the inspection beam can be set separately in a case where only the inspection beam is emitted, a case where the inspection beam and the working laser are emitted ("material inspection"), and a case where the inspection beam and the working electron beam are emitted ("electrical inspection").

In the example of FIG. 15, the irradiation conditions for the working laser are displayed at a lower stage of a "material inspection" column. The irradiation conditions for the working laser include one or more of irradiation energy (for example, a wavelength and an average power), polarization (for example, S polarization or P polarization), and the like. The working laser can also be emitted in a pulse shape, and in this case, the irradiation conditions for the working laser may include a pulse width and/or a pulse period.

Further, in the example of FIG. 15, the irradiation conditions for the working electron beam are displayed at a lower stage of an "electrical inspection" column. The irradiation conditions for the working electron beam include irradiation energy (for example, an acceleration voltage) and/or an irradiation amount (for example, an irradiation current and an irradiation period). The working electron beam can also be emitted in a pulse shape, and in this case, the irradiation conditions for the working electron beam may include a pulse width and/or a pulse period.

In this manner, in the present embodiment, the inspection beam, the first working beam (working laser), and the second working beam (working electron beam) can all be emitted under different conditions. Note that it is not necessary to emit all of these beams under different conditions, at least one of the inspection beam, the first working beam, and the second working beam may be able to be set differently with respect to the other two beams. Here, the beams being "different" means that one or more of a beam type (for example, whether a beam is visible light or light with a wavelength shorter than that of the visible light, whether a beam is an electromagnetic wave with a wavelength longer than that of the visible light, whether a beam is a charged particle beam, or the like), irradiation energy (energy or a wavelength), an irradiation period, an irradiation region, and the like are different.

Since various types of beams can be emitted under various irradiation conditions in this manner, various pieces of information can be acquired as the feature values as will be described below.

Returning back to FIG. 14, after step S104, the computer system 140 controls the inspection beam control system 120 to emit the inspection beam, and acquires the image I1 (step S105). For example, the computer system 140 generates an image of the sample 200 based on a detection signal received from the detector 105 (a detection signal after processing performed by the signal processing unit 121 in the present embodiment).

Next, the computer system 140 (for example, the dimension analysis unit 152) acquires the first feature value (for example, a diameter of a plug) regarding the pattern on the sample based on the image I1 (step S106, FIG. 11(*a*)).

Next, the computer system 140 controls the inspection beam control system 120 and the working beam control system 130 to emit the working laser and the inspection beam, and acquires the image I2 (step S107). For example, the computer system 140 generates the image of the sample 200 based on the detection signal received from the detector 105 (the detection signal after the processing performed by the signal processing unit 121 in the present embodiment).

Next, the computer system 140 (for example, the material characteristic analysis unit 153) acquires the second feature value (for example, a film thickness of a plug) regarding the pattern on the sample based on the image I2 (step S108, FIG. 11(*b*)). Here, the computer system 140 may acquire a change in the amount of the secondary electrons between the image I1 and the image I2 and acquire the second feature value based on the change.

Next, the computer system 140 controls the inspection beam control system 120 and the working beam control system 130 to emit the working electron beam and the inspection beam, and acquires the image I3 (step S109). For example, the computer system 140 generates the image of the sample 200 based on the detection signal received from the detector 105 (the detection signal after the processing performed by the signal processing unit 121 in the present embodiment).

Next, the computer system 140 (for example, the electrical characteristic analysis unit 154) acquires the third feature value (for example, capacitance) regarding the pattern on the sample based on the image I3 (step S110, FIG. 11(*c*)). Here, the computer system 140 may acquire a change in the amount of the secondary electrons between the image I1 and the image I3 and acquire the third feature value based on the change.

Next, the computer system 140 analyzes a correlation between characteristics at the same location (step S111, FIG. 12). Next, the computer system 140 outputs results of the correlation analysis (step S112, FIG. 13).

FIG. 16 illustrates an example of a UI screen output in relation to the processing of FIG. 15. The UI screen includes the images I1 to I3. In addition, the UI screen also includes an image I4 representing a defect of each pattern sample (for example, one of the graphs illustrated in FIG. 13 is displayed to be switchable). In the image I4, the user may freely change a threshold value for determining a defect. In addition, the UI screen also includes images I5 and I6 representing a global distribution situation of defects in the sample 200. The image I5 corresponds to a determination result based on the graph illustrated in FIG. 13(*a*), and the image I6 corresponds to a determination result based on the graph illustrated in FIG. 13(*b*).

Returning back to FIG. 14, after step S112, the computer system 140 terminates the processing of FIG. 14 (step S113). As described above, according to the inspection system 100 according to the first embodiment, it becomes easier to analyze the correlation between the plurality of characteristics at the same location.

Second Embodiment

Hereinafter an inspection system according to a second embodiment will be described. Descriptions of portions in common with those of the first embodiment may be omitted.

FIG. 17 illustrates a configuration of an inspection system 100 according to the second embodiment. In the second embodiment, an electron beam emitted from an electron source 102 functions not only as an inspection beam but also as a working electron beam. The inspection system 100 according to the second embodiment includes a deflector 109 instead of the electron gun 106 of the inspection system 100 (FIG. 7) according to the first embodiment. A working beam control system 130 (especially an electron gun control unit 132) controls the deflector 109 to deflect the working electron beam so that the working electron beam is emitted to a desired position in a sample 200.

In addition, the inspection system 100 includes a database 170. The database 170 stores a relationship between an amount or a change amount of secondary electrons related to irradiation with at least one of a working laser and the working electron beam and at least one of a second feature value and a third feature value. In the present embodiment, the database 170 stores a relationship between the amount or the change amount of the secondary electrons related to irradiation with the working laser and the second feature value, and a relationship between the amount or the change amount of the secondary electrons related to irradiation with the working electron beam and the third feature value. For example, the second feature value (or the third feature value) is associated with a set of irradiation conditions for the working laser (or the working electron beam) and the amount or the change amount of the secondary electrons, or a series of these sets. The database 170 can be created in advance.

The inspection system 100 refers to the database 170 in steps S108 and S110 (FIG. 14). For example, a computer system 140 acquires at least one of the second and third feature values with reference to the database 170 based on the amount or the change amount of the secondary electrons related to irradiation with at least one of the working laser and the working electron beam.

By acquiring the second and/or third feature values in this manner, it is possible to acquire more precise feature values based on the previous measurement data.

FIG. 18 illustrates an irradiation timing of each working beam according to the second embodiment. FIG. 18(*a*) illustrates an irradiation timing when material characteristics are measured based on a second inspection image. The inspection beam and the working laser are emitted, and the working electron beam is not emitted. In addition, the working laser and the inspection beam are emitted such that an irradiation timing of the working laser and an irradiation timing of the inspection beam do not overlap each other. The detector operates only while the inspection beam is emitted, and does not operate while the working laser is emitted.

FIG. 18(*b*) illustrates an irradiation timing when electrical characteristics are measured based on a third inspection image. The inspection beam and the working electron beam are emitted, and the working laser is not emitted. In addition, the working electron beam and the inspection beam are emitted such that an irradiation timing of the working electron beam and an irradiation timing of the inspection beam do not overlap each other. In particular, the irradiation with the inspection beam is started after a predetermined interval from the time when the irradiation with the working electron beam is terminated.

As illustrated in FIG. 18(*b*), an inspection beam control system 120 may include a chopper. Switching between whether the electron beam emitted from the electron source 102 becomes the inspection beam and whether the electron beam becomes the working electron beam may be performed under the control of the chopper.

In this manner, it is also possible to adopt a configuration in which a first or second working beam (in the present embodiment, a working electron beam which is a second working beam) is an inspection beam emitted in a pulse shape. With such a configuration, a working beam irradiation mechanism (for example, the electron gun 106) can be omitted, and a configuration is simplified.

FIG. 19 illustrates a specific example of the sample 200 according to the second embodiment. Machining processes for the sample 200 include a process A and a process B. In addition, as illustrated in FIG. 19(*a*), in the process A, SiO2 is deposited on an Si substrate and then etched to form an SiO2 region on the Si substrate. Thereafter, as illustrated in FIG. 19(*b*), in the process B, Poly-Si (polysilicon) is further deposited and then etched to form a Poly-Si region on the SiO2 region.

Although three patterns are formed in FIG. 19(*b*), these patterns are referred to as ID1 to ID3, respectively. Note that it is assumed that only a middle pattern (ID2) has a low SiO2 quality (a tile pattern in the drawing is shown differently).

In the second embodiment, the operations illustrated in FIG. 14 are performed for each of the processes A and B. FIG. 20 illustrates an example of measurement results immediately after the process A (before the process B). FIG. 20(*a*) illustrates results of measurement of material characteristics. Although the amount of the secondary electrons decreases when the wavelength of the working laser is lengthened, the amount of the secondary electrons in ID2 decreases more slowly than in ID1 and ID3, which indicates that ID2 has poor crystallinity. FIG. 20(*b*) illustrates results of measurement of electrical characteristics. Although the amount of the secondary electrons changes when an interval between the working electron beam and the inspection beam is changed, ID2 has a large amount of secondary electrons regardless of the interval, which indicates that ID2 has poor insulation.

FIG. 21 illustrates an example of measurement results immediately after the process B. FIG. 21(*a*) illustrates results of measurement of material characteristics. The crystallinity of ID2 is greatly improved as compared with that illustrated in FIG. 20(*a*), which is not much different from ID1 and ID3. That is, it can be understood that the crystallinity of ID2 is improved as the process progresses.

FIG. 21(*b*) illustrates results of measurement of electrical characteristics. The insulation of ID2 is slightly improved as compared with that illustrated in FIG. 20(*b*), but is still poor as compared with ID1 and ID3. That is, it can be understood that the insulation of ID2 is not much improved even when the process progresses.

FIG. 22 illustrates an example of changes in feature values as the process progresses. FIG. 22(*a*) illustrates an example of changes in material characteristics (crystallinity in this example), and FIG. 22(*b*) illustrates an example of changes in electrical characteristics (insulation in this example). Note that values illustrated in FIG. 22 are not directly related to the values illustrated in FIGS. 20 and 21. Each feature value measured in each process is output in association with each process.

In this manner, the computer system 140 according to the second embodiment acquires information indicating a plurality of machining processes (the processes A and B in the present embodiment) for the sample 200. In addition, the computer system 140 acquires at least one (crystallinity as the second feature value and insulation as the third feature value in the present embodiment) of a first, the second, and the third feature values for each of the plurality of machining processes for the sample 200. Then, the computer system 140 outputs at least one of the first, second, and third feature values (crystallinity as the second feature value and insulation as the third feature value in the present embodiment) related to each of the machining processes in association with the machining process.

By outputting the feature values in association with the processes in this manner, it is possible to easily ascertain changes in the feature values as the process progresses.

Third Embodiment

Hereinafter, an inspection system according to a third embodiment will be described. Descriptions of portions in common with those of the first or second embodiment may be omitted.

Figure 23:
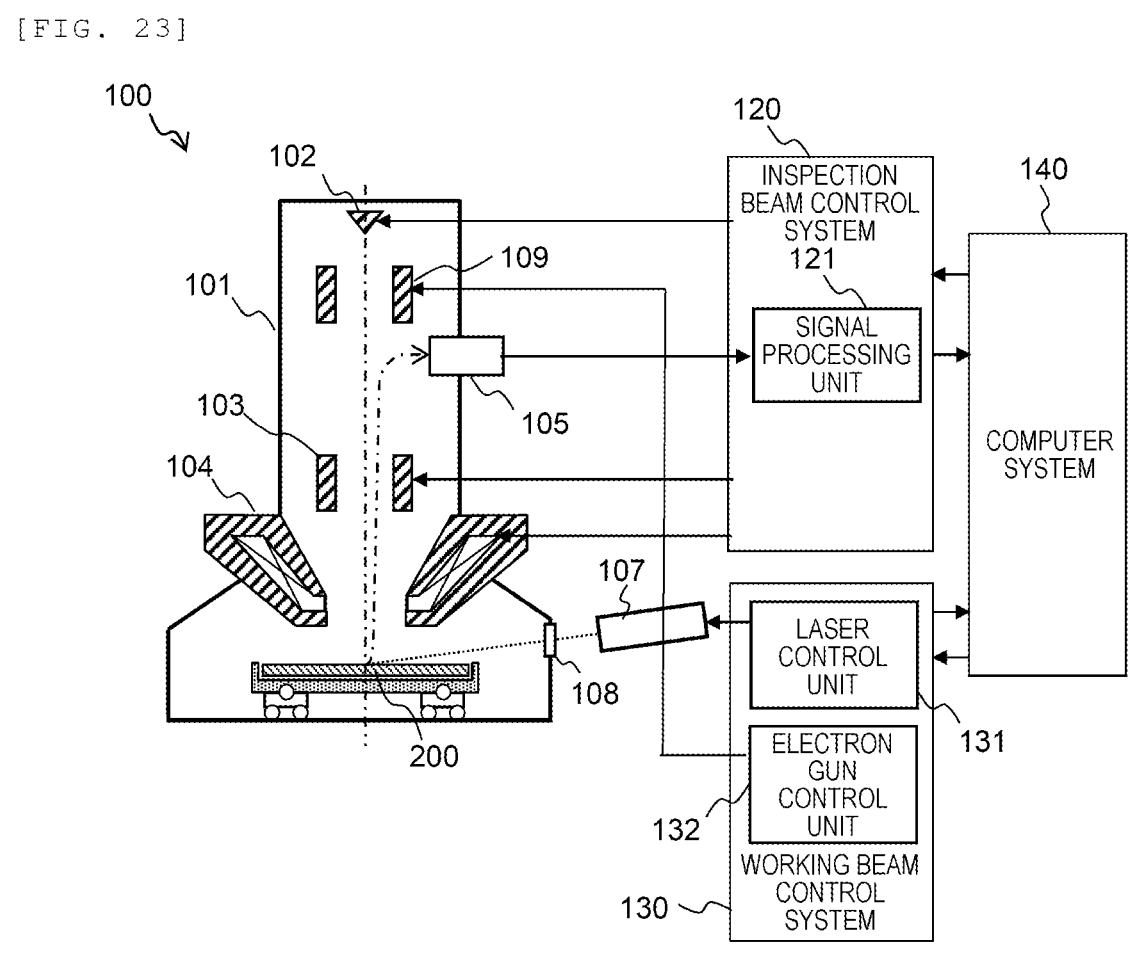

FIG. 23 illustrates a configuration of an inspection system 100 according to the third embodiment. Similarly to the second embodiment (FIG. 17), a deflector 109 is provided instead of the electron gun 106 (FIG. 7). In addition, the database 170 (FIG. 17) may be omitted as illustrated in the drawing.

Figures 24A, 24B:
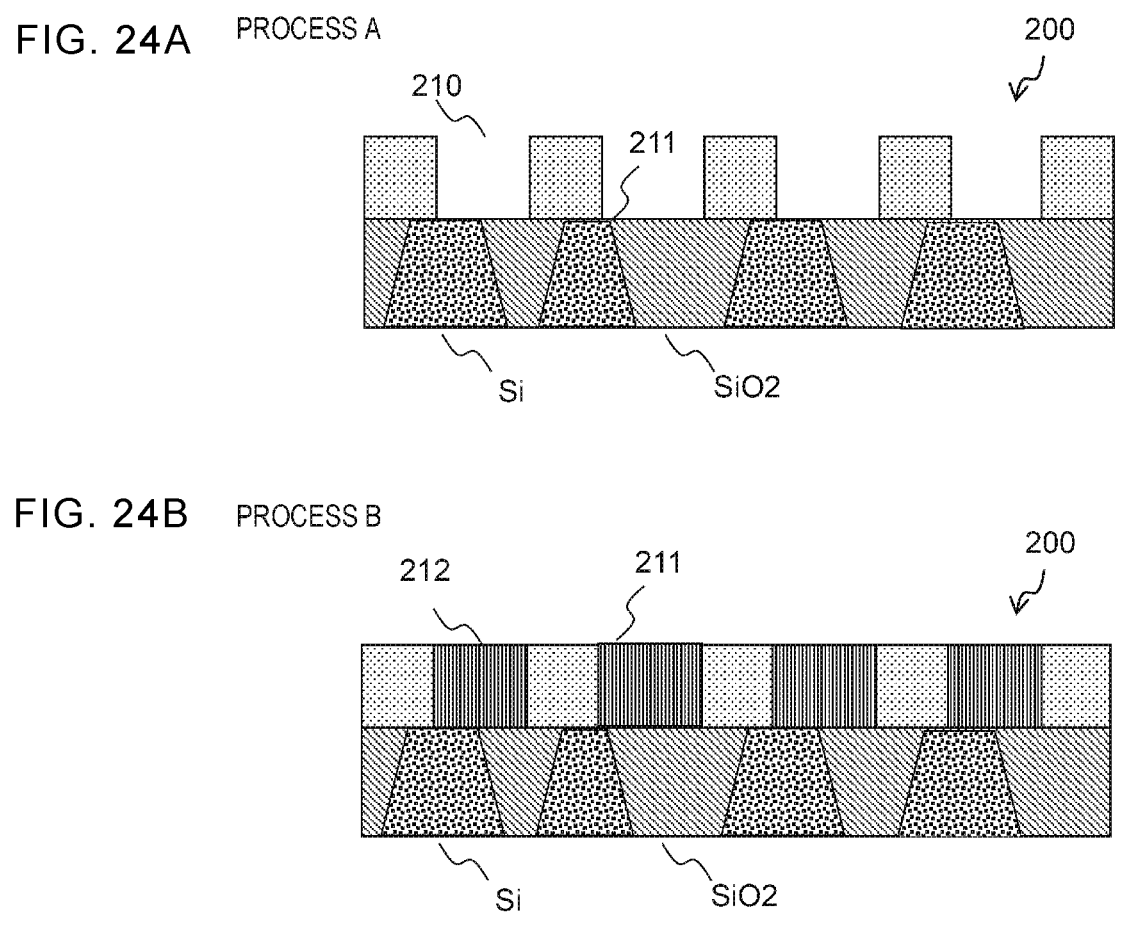

FIG. 24 illustrates a specific example of a sample 200 according to the third embodiment. Machining processes for the sample 200 include a process A and a process B. First, as illustrated in FIG. 24(*a*), in the process A, a partial region in an Si substrate is oxidized to SiO2, and contact holes 210 are formed to partially expose an Si region. Here, one of the contact holes 210 has a small exposed area of the Si region and is a defect 211.

Thereafter, as illustrated in FIG. 24(*b*), the contact hole 210 is filled to form a contact plug 212, but a contact area between the contact plug 212 and the Si region is small in a portion corresponding to the defect 211 as described above.

FIG. 25 illustrates measurement results according to the third embodiment. FIG. 25(*a*) illustrates an example of results of measurement of a dimension (a diameter of the contact hole 210 in the longitudinal direction) immediately after the process A (before the process B). FIG. 25(*b*) illustrates an example of results of measurement of material characteristics immediately after the process A (before the process B). A composition of a material (Si or SiO2) is measured as the material characteristic, and an overlay amount (the width of the Si region exposed in the contact hole 210) or the contour of the Si region is measured based on the composition. The contact hole 210 corresponding to the defect 211 has a small overlay amount.

FIG. 25(*c*) illustrates an example of results of measurement of electrical characteristics immediately after the process B. The contact plug 212 corresponding to the defect 211 has a higher resistance than those of the other contact plugs 212 (shown in dark gray). In addition, a portion of the contact plug 212 that does not correspond to the defect 211 (a contact plug 212*a* shown in medium gray in the example of FIG. 25(*c*)) has a normal overlay amount but has a large resistance.

In the third embodiment, the computer system 140 classifies patterns (the contact holes 210 and the contact plugs 212 in the present embodiment). That is, patterns (the contact holes 210 and the contact plugs 212 in the present embodiment) are classified based on at least one of the first, second, and third feature values (in the present embodiment, a dimension as the first feature value, an overlay amount based on a composition as the second feature value, and a resistance as the third feature value). This classification is performed, for example, based on a predetermined range.

FIG. 26 illustrates an example of results of pattern classification. A horizontal axis in FIG. 26(*a*) represents the diameter of the contact hole 210, and a vertical axis represents the overlay amount. A horizontal axis in FIG. 26(*b*) represents the overlay amount, and a vertical axis represents electrical characteristics (for example, a resistance). Upper and lower limits in a normal range are designated for the horizontal and vertical axes in FIG. 26(*a*) and the vertical axis in FIG. 26(*b*). A pattern in the normal range is classified as "good", and a pattern out of the normal range is classified as "bad". The computer system 140 may output such classification results.

FIG. 27 illustrates another example of the results of the pattern classification. The computer system 140 may output classification results in a format as illustrated in FIG. 27. Each of FIGS. 27(*a*) to 27(*c*) shows regions partitioned on a wafer and shows the number or density of patterns determined to be bad for each region.

By performing pattern classification in this manner, it is possible to easily ascertain characteristics (good/bad, and the like) of patterns.

Fourth Embodiment

Hereinafter, an inspection system according to a fourth embodiment will be described. Descriptions of portions in common with those of any one of the first to third embodiments may be omitted.

Figure 28A:
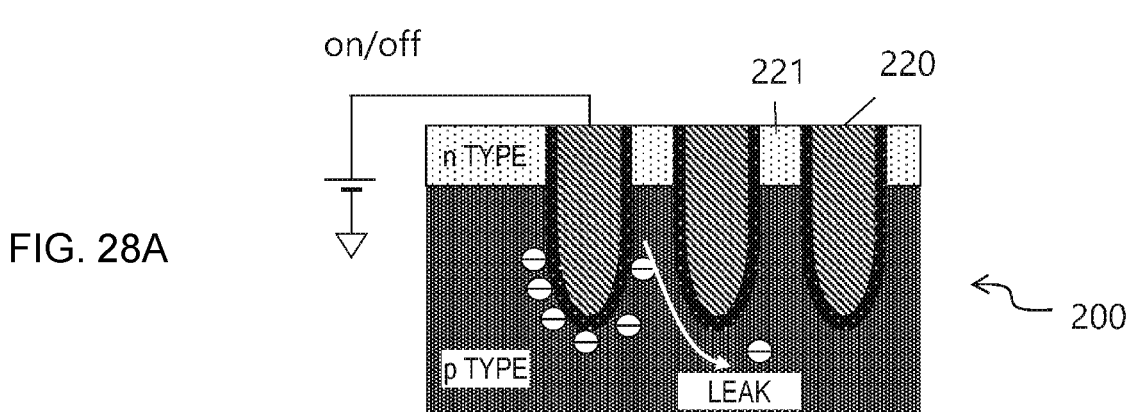
FIGS. 28A and 28B are diagrams illustrating implant control of a sample according to a fourth embodiment.
Figure 28B:
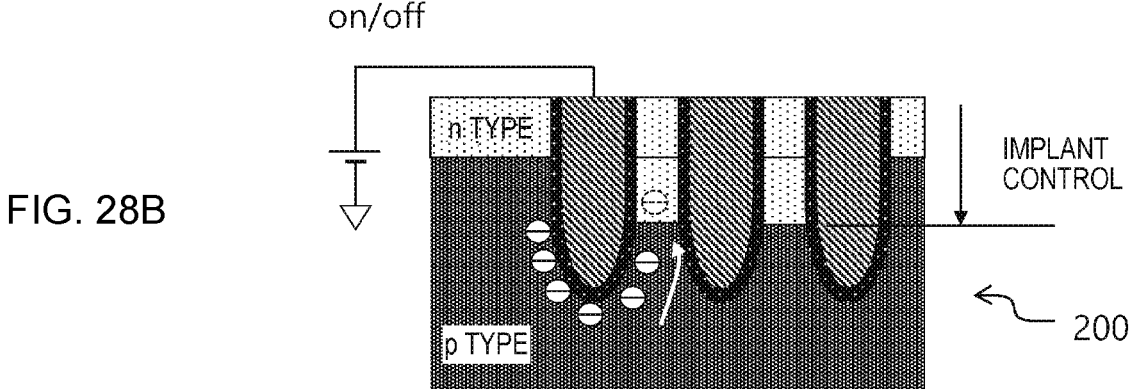

Implant control of a sample 200 according to the fourth embodiment will be described with reference to FIG. 28. A gate 220 and a source/drain 221 are formed in the sample 200 as a pattern. As illustrated in FIG. 28(*a*), when an implant depth of the source/drain 221 is excessively small, a non-negligible leak current occurs, which is not preferable. Consequently, as illustrated in FIG. 28(*b*), it is preferable to suppress a leak current by appropriately controlling the implant depth.

FIG. 29 illustrates a principle of a method for controlling the implant depth using the inspection system according to the fourth embodiment. FIG. 29(*a*) illustrates a relationship between a dimension of a pattern and an RC time constant at the time of irradiation with a working electron beam. A normal range is determined by performance specifications.

FIG. 29(*b*) illustrates a relationship between the RC time constant (one of electrical characteristics) at the time of irradiation with the working electron beam and an RC time constant (one of material characteristics) at the time of irradiation with a working laser. In a case where the working laser has a long wavelength (symbol $\Delta$, $\lambda$=500 nm), the RC time constant at the time of irradiation with the working electron beam and the RC time constant at the time of irradiation with the working laser have a high correlation, but in a case where the working laser has a short wavelength (symbol $\circ$, $\Delta$=400 nm, or symbol $\square$, $\lambda$=300 nm), the RC time constant at the time of irradiation with the working electron beam and the RC time constant at the time of irradiation with the working laser are not correlated with each other or have a low correlation.

Since the relationships illustrated in FIGS. 29(*a*) and 29(*b*) can be acquired using the inspection system, the sample 200 can be designed based on the relationships. For example, a relationship between a wavelength of light and a depth at which the light is incident on the sample 200 can be measured or calculated in advance as illustrated in FIG. 29(*c*). In addition, from the results in FIG. 29(*b*), it can be understood that a leak current can be appropriately suppressed by performing implantation to a depth of 300 nm where a working laser with a wavelength of 400 nm enters.

In this manner, by outputting the relationships between the feature values, the sample 200 (or pattern) can be designed more appropriately.

Fifth Embodiment

Hereinafter, an inspection system according to a fifth embodiment will be described. Descriptions of portions in common with those of any one of the first to fourth embodiments may be omitted.

Figure 30A:
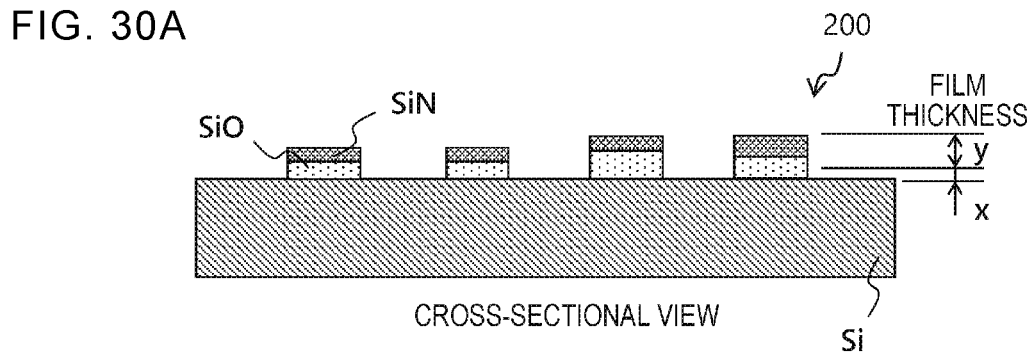
FIGS. 30A and 30B are diagrams illustrating a specific example of a sample according to a fifth embodiment.
Figure 30B:
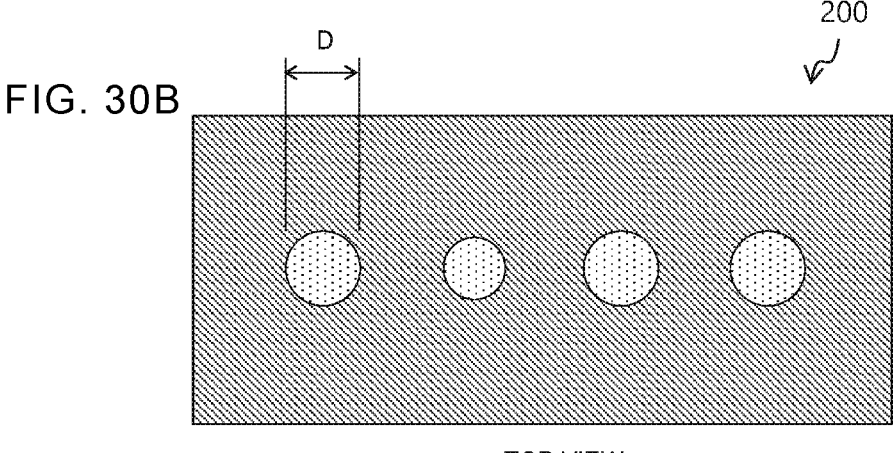

FIG. 30 illustrates a specific example of a sample 200 according to the fifth embodiment. FIG. 30(*a*) is a cross-sectional view, and FIG. 30(*b*) is a top view. An SiO film and an SiN film are formed on an Si substrate to form a pattern as a stacked film.

A thickness x of the SiO film and a thickness y of the SiN film may vary depending on variations in film formation conditions. In addition, a dimension D (for example, a diameter) may vary depending on patterning conditions. Since the performance of the sample 200 changes depending on the film thicknesses x and y and the dimension D, it is useful to appropriately measure and manage these values.

Figure 31A:
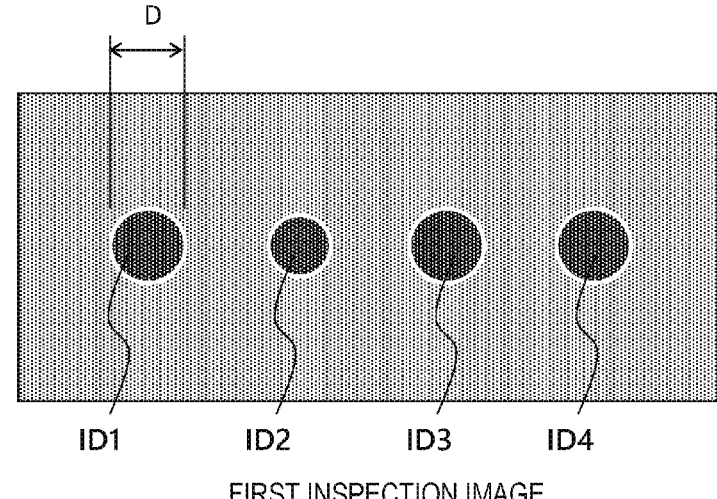
FIGS. 31A and 31B are diagrams illustrating an example of measurement results a dimension D, according to the fifth embodiment.
Figure 31B:
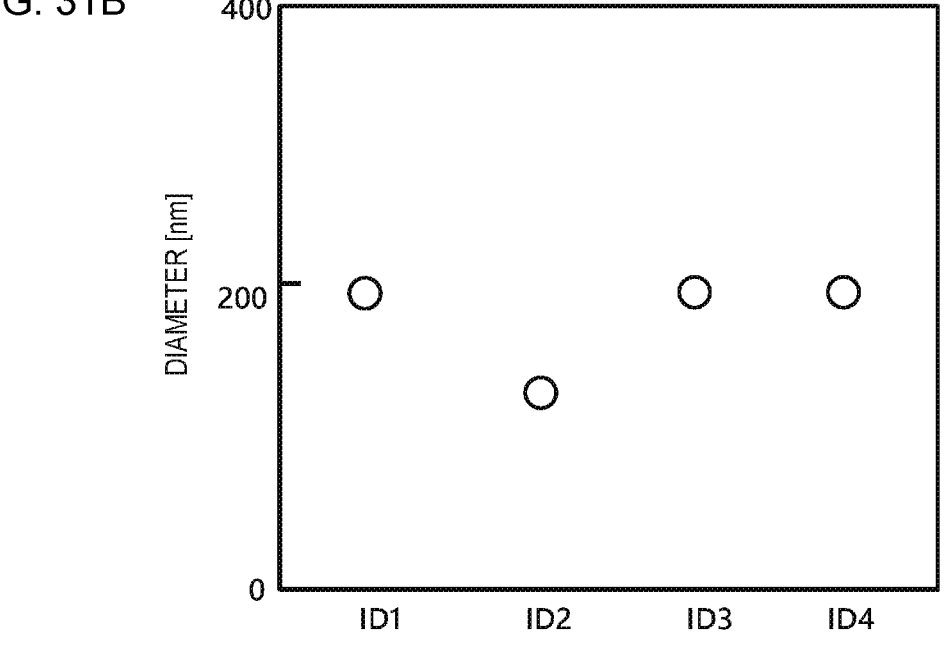

FIG. 31 illustrates an example of measurement results of the dimension D. FIG. 31(*a*) illustrates an inspection image (first inspection image) in a state where a working beam is not used, and FIG. 31(*b*) illustrates the dimension D (diameter) of each pattern. In this example, an acceleration voltage of an inspection beam is set to 800 V, and a current is set to 8 pA. Although four patterns are formed in FIG. 31(*a*), these patterns are referred to as ID1 to ID4, respectively.

Figure 32A:
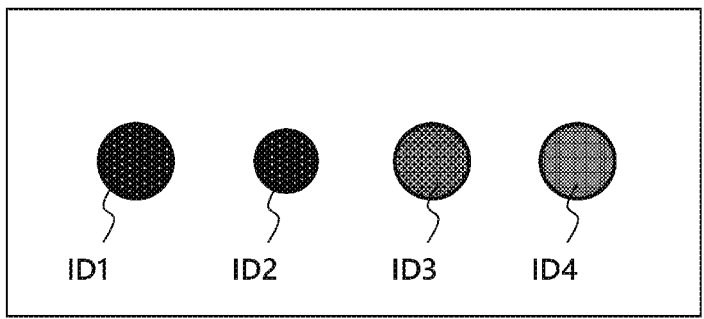
FIGS. 32A to 32C are diagrams illustrating an example of measurement results of material characteristics, according to the fifth embodiment.
Figure 32B:
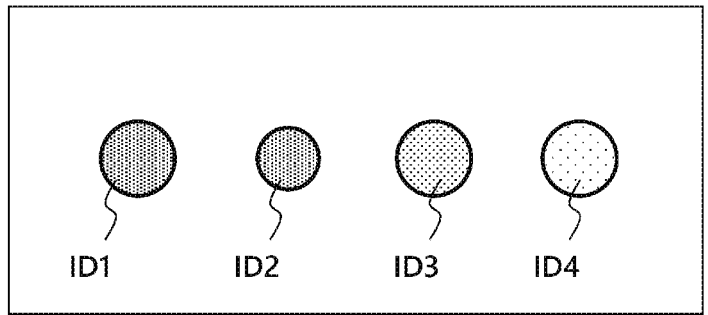
Figure 32C:
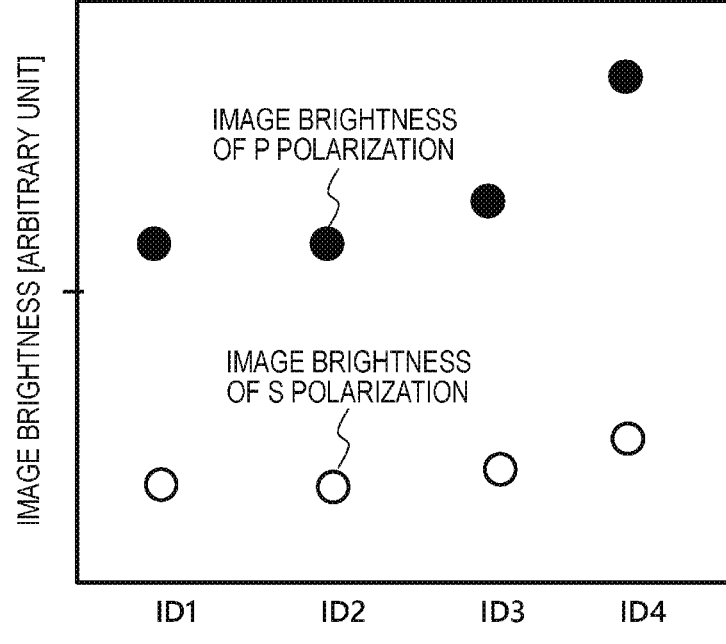

FIG. 32 illustrates an example of measurement results of material characteristics. In this example, the material characteristic is a depth in a direction perpendicular to a screen (that is, a dimension that is at least not directly visible in an inspection image). In this example, the wavelength of a working laser is set to 350 nm, an average power is set to 500 mW, and a second inspection image is acquired using S and P polarization, respectively. An acceleration voltage of an inspection beam is set to 500 V, and a current is set to 20 pA. FIG. 32(*a*) illustrates an image when the S polarization is used, and FIG. 32(*b*) illustrates an image when the P polarization is used. These are all second inspection images.

FIG. 32(*c*) illustrates a brightness (corresponding to the amount of secondary electrons) of each pattern in each inspection image. Based on the brightness, light absorbance of each pattern can be calculated. Further, in the present embodiment, a relationship between a composition of a material and light absorbance with respect to each polarization is stored in the database 170 (see FIG. 17) or the like in advance.

FIG. 33 illustrates a specific example of light absorbance. In the present embodiment, each pattern is formed from two types of films, and brightnesses with respect to two types of polarization are measured, and thus the film thicknesses x and y can be calculated by solving simultaneous equations. The example of FIG. 33 is as follows.

$$x+3y=f(Ss)$$

$$5x+20y=f(Sp)$$

However, Ss represents a brightness in an inspection image when the working laser is set to be the S polarization, and Sp represents a brightness in an inspection image when the working laser is set to be the P polarization. For example, functions f(Ss) and f(Sp) are linear functions and are stored in the database 170 or the like.

FIG. 34 illustrates an example of calculation results of the film thicknesses x and y. In this manner, a dimension (thickness) in the depth direction of an image can be measured as a second feature value by using the second inspection image, and thus a thickness at each position of a pattern can be known when the second inspection image is combined with the first inspection image.

Figure 35A:
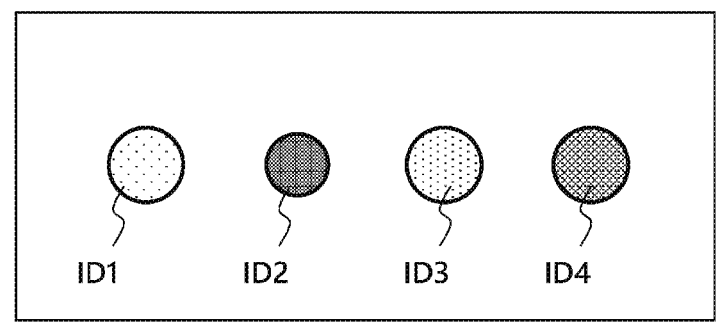
FIGS. 35A and 35B are diagrams illustrating an example of measurement results of electrical characteristics, according to the fifth embodiment.
Figure 35B:
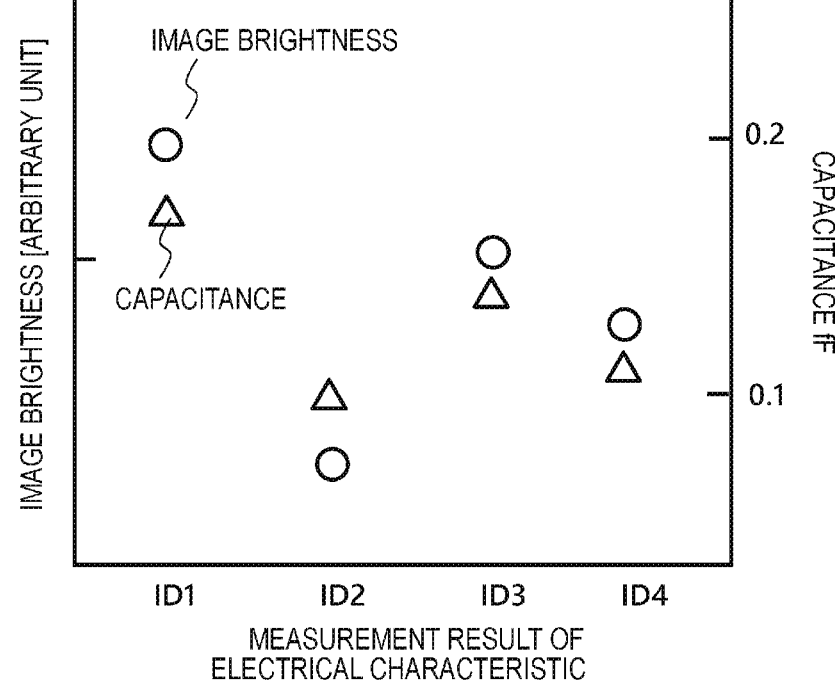

FIG. 35 illustrates an example of measurement results of electrical characteristics (capacitance). In this example, an acceleration voltage of a working electron beam is set to 500 V, a current is set to 100 pA, and an interval (see FIG. 18(*b*)) is set to 1 μs. In addition, an acceleration voltage of the inspection beam is set to 500 V, and a current is set to 20 pA.

FIG. 35(*a*) is an image at the time of measurement of electrical characteristics, that is, a third inspection image. FIG. 35(*b*) illustrates the brightness (corresponding to capacitance) of each pattern in the inspection image. A relationship between the brightness and the capacitance can be stored, for example, in the database 170 in advance.

In this manner, the capacitance can be measured as a third feature value by using the third inspection image, and thus the correlation between the feature values at each position of the pattern can be easily analyzed when the third inspection image is combined with the first and second inspection images.

Other Embodiments

Although the above-described first to fifth embodiments have been presented as independent embodiments, some of the different embodiments can also be implemented in combination with each other.

Further, in the first to fifth embodiments, an inspection beam and a second working beam are electron beams, and a first working beam is a working laser, but the type of each beam can be changed freely.

Further, in the first to fifth embodiments, a first feature value is an amount related to a dimension, a second feature value is an amount related to material characteristics, and a third feature value is an amount related to electrical characteristics, but the feature values can be changed freely.

REFERENCE SIGNS LIST

100: inspection system
102: electron source (inspection beam irradiation system)
105: detector
106: electron gun (first working beam irradiation system)
107: laser device (first working beam irradiation system)
140: computer system
170: database
200: sample
211: defect
D: dimension (first feature value)
x, y: thickness (second feature value)
B1: inspection beam
B2: laser (first working beam)
B3: electron beam (second working beam)
B4: secondary electrons (secondary charged particles)
I1: image (first inspection image)
I2: image (second inspection image)
I3: image (third inspection image)
P1, P2, P3: pattern

The invention claimed is:

1. An inspection system comprising:

an inspection beam irradiation system that irradiates a semiconductor sample with an inspection beam which is an electron beam;

a detector that detects secondary charged particles obtained by irradiating the semiconductor sample with the inspection beam and outputs a detection signal;

a first working beam irradiation system that emits a first working beam for changing an amount of the secondary charged particles;

a second working beam irradiation system that emits a second working beam for changing the amount of the secondary charged particles;

a computer system that generates an inspection image of the semiconductor sample based on the detection signal;

wherein the inspection beam, the first working beam, and the second working beam are different from each other, and wherein the computer system generates a first inspection image related to irradiation with the inspection beam, acquires a first feature value regarding patterns on the semiconductor sample based on the first inspection image, generates a second inspection image related to irradiation with the first working beam and the inspection beam, acquires a second feature value regarding the patterns based on the second inspection image, generates a third inspection image related to irradiation with the second working beam and the inspection beam, and acquires a third feature value regarding the patterns based on the third inspection image; and a database that stores a relationship between an amount or a change amount of secondary charged particles related to irradiation with at least one of the first and second working beams and at least one of the second and third feature values, wherein the computer system acquires at least one of the second and third feature values with reference to the database based on the amount or the change amount of the secondary charged particles related to irradiation with at least one of the first and second working beams.

2. An inspection system comprising:

an inspection beam irradiation system that irradiates a semiconductor sample with an inspection beam which is an electron beam;

a detector that detects secondary charged particles obtained by irradiating the semiconductor sample with the inspection beam and outputs a detection signal;

a first working beam irradiation system that emits a first working beam for changing an amount of the secondary charged particles;

a second working beam irradiation system that emits a second working beam for changing the amount of the secondary charged particles; and a computer system that generates an inspection image of the semiconductor sample based on the detection signal;

wherein the inspection beam, the first working beam, and the second working beam are different from each other, wherein the computer system generates a first inspection image related to irradiation with the inspection beam, acquires a first feature value regarding patterns on the semiconductor sample based on the first inspection image, generates a second inspection image related to irradiation with the first working beam and the inspection beam, acquires a second feature value regarding the patterns based on the second inspection image, generates a third inspection image related to irradiation with the second working beam and the inspection beam, and acquires a third feature value regarding the patterns based on the third inspection image, and wherein the computer system classifies the patterns based on at least one of the first, second, and third feature values and a predetermined range.

3. The inspection system according to claim 2, wherein at least one of the inspection beam, the first working beam, and the second working beam is different from the other two beams in one or more of an irradiation energy, an irradiation period, and an irradiation region.

4. The inspection system according to claim 3, wherein the first working beam is a laser, and the second working beam is an electron beam.

5. The inspection system according to claim 3, wherein the first or second working beam is emitted in a pulse shape.

6. The inspection system according to claim 2, wherein the first feature value includes dimensions shown in the first inspection image.

7. The inspection system according to claim 2, wherein the second feature value includes at least one of a dimension shown in the second inspection image, a dimension that is not shown in the second inspection image, a composition, information on a dopant, information on crystallinity, a carrier mobility, a carrier lifetime, and an RC time constant.

8. The inspection system according to claim 2, wherein the third feature value includes at least one of an electrical resistance, a capacitance, V-I characteristic, and an RC time constant.

9. The inspection system according to claim 2, wherein the computer system acquires information indicating defects of the patterns based on at least one of the first, second, and third feature values and a predetermined threshold value.

10. An inspection system comprising:

an inspection beam irradiation system that irradiates a semiconductor sample with an inspection beam which is an electron beam;

a detector that detects secondary charged particles obtained by irradiating the semiconductor sample with the inspection beam and outputs a detection signal;

a first working beam irradiation system that emits a first working beam for changing an amount of the secondary charged particles;

a second working beam irradiation system that emits a second working beam for changing the amount of the secondary charged particles; and a computer system that generates an inspection image of the semiconductor sample based on the detection signal;

wherein the inspection beam, the first working beam, and the second working beam are different from each other, wherein the computer system generates a first inspection image related to irradiation with the inspection beam, acquires a first feature value regarding patterns on the semiconductor sample based on the first inspection image, generates a second inspection image related to irradiation with the first working beam and the inspection beam, acquires a second feature value regarding the patterns based on the second inspection image, generates a third inspection image related to irradiation with the second working beam and the inspection beam, and acquires a third feature value regarding the patterns based on the third inspection image, and wherein the computer system acquires at least one of the first, second, and third feature values for each of a plurality of machining processes for the semiconductor sample, and outputs at least one of the first, second, and third feature values related to each of the machining processes in association with the machining process.

11. An inspection method comprising:

irradiating a semiconductor sample with an inspection beam which is an electron beam;

detecting secondary charged particles obtained by irradiating the semiconductor sample with the inspection beam and outputting a detection signal;

emitting a first working beam for changing an amount of the secondary charged particles;

emitting a second working beam for changing the amount of the secondary charged particles; and generating an inspection image of the semiconductor sample based on the detection signal, wherein the inspection beam, the first working beam, and the second working beam are different from each other, wherein a computer system generates a first inspection image related to irradiation with the inspection beam, acquires a first feature value regarding patterns on the semiconductor sample based on the first inspection image, generates a second inspection image related to irradiation with the first working beam and the inspection beam, acquires a second feature value regarding the patterns based on the second inspection image, generates a third inspection image related to irradiation with the second working beam and the inspection beam, and acquires a third feature value regarding the patterns based on the third inspection image, and wherein the computer system classifies the patterns based on at least one of the first, second, and third feature values and a predetermined range.

12. A non-transitory computer readable medium comprising a plurality of instructions that, when executed by a processor, cause the processor to:

irradiate a semiconductor sample with an inspection beam which is an electron beam;

detect secondary charged particles obtained by irradiating the semiconductor sample with the inspection beam and outputting a detection signal;

emit a first working beam for changing an amount of the secondary charged particles;

emit a second working beam for changing the amount of the secondary charged particles; and generate an inspection image of the semiconductor sample based on the detection signal, wherein the inspection beam, the first working beam, and the second working beam are different from each other, wherein the processor generates a first inspection image related to irradiation with the inspection beam, acquires a first feature value regarding patterns on the semiconductor sample based on the first inspection image, generates a second inspection image related to irradiation with the first working beam and the inspection beam, acquires a second feature value regarding the patterns based on the second inspection image, generates a third inspection image related to irradiation with the second working beam and the inspection beam, and acquires a third feature value regarding the patterns based on the third inspection image, and wherein the computer system classifies the patterns based on at least one of the first, second, and third feature values and a predetermined range.

* * * * *